United States Patent
Van Dal et al.

(10) Patent No.: US 12,069,874 B2
(45) Date of Patent: *Aug. 20, 2024

(54) METHODS OF MANUFACTURING A FIELD EFFECT TRANSISTOR USING CARBON NANOTUBES AND FIELD EFFECT TRANSISTORS

(71) Applicant: Taiwan Semiconductor Manufacturing Co., Ltd., Hsinchu (TW)

(72) Inventors: Marcus Johannes Henricus Van Dal, Hsinchu (TW); Timothy Vasen, Hsinchu (TW); Gerben Doornbos, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/311,730

(22) Filed: May 3, 2023

(65) Prior Publication Data

US 2023/0276640 A1 Aug. 31, 2023

Related U.S. Application Data

(63) Continuation of application No. 17/374,804, filed on Jul. 13, 2021, now Pat. No. 11,659,721, which is a continuation of application No. 16/590,115, filed on Oct. 1, 2019, now Pat. No. 11,088,337.

(60) Provisional application No. 62/770,009, filed on Nov. 20, 2018.

(51) Int. Cl.
| | |
|---|---|
| H10K 71/60 | (2023.01) |
| H10K 10/46 | (2023.01) |
| H10K 10/84 | (2023.01) |
| H10K 19/10 | (2023.01) |
| H10K 85/20 | (2023.01) |

(52) U.S. Cl.
CPC ......... *H10K 10/481* (2023.02); *H10K 10/486* (2023.02); *H10K 10/84* (2023.02); *H10K 19/10* (2023.02); *H10K 71/60* (2023.02); *H10K 85/221* (2023.02)

(58) Field of Classification Search
CPC .............................. H10K 71/60; H10K 10/481
See application file for complete search history.

(56) References Cited

U.S. PATENT DOCUMENTS

| | | | |
|---|---|---|---|
| 9,472,773 B1 | 10/2016 | Rosenblatt et al. | |
| 9,899,515 B1 | 2/2018 | Cheng et al. | |
| 11,088,337 B2 | 8/2021 | Vasen et al. | |
| 11,659,721 B2 * | 5/2023 | Vasen .................. | H10K 10/491 257/29 |
| 2008/0241755 A1 | 10/2008 | Franklin et al. | |
| 2009/0194424 A1 | 8/2009 | Franklin et al. | |

(Continued)

*Primary Examiner* — Douglas M Menz
(74) *Attorney, Agent, or Firm* — Seed IP Law Group LLP

(57) ABSTRACT

In a method of forming a gate-all-around field effect transistor, a gate structure is formed surrounding a channel portion of a carbon nanotube. An inner spacer is formed surrounding a source/drain extension portion of the carbon nanotube, which extends outward from the channel portion of the carbon nanotube. The inner spacer includes two dielectric layers that form interface dipole. The interface dipole introduces doping to the source/drain extension portion of the carbon nanotube.

20 Claims, 23 Drawing Sheets

(56) References Cited

U.S. PATENT DOCUMENTS

| | | |
|---|---|---|
| 2010/0075130 A1 | 3/2010 | Meng et al. |
| 2013/0313524 A1 | 11/2013 | De Micheli et al. |
| 2018/0151564 A1 | 5/2018 | Lee et al. |
| 2019/0097147 A1 | 3/2019 | Lu et al. |
| 2020/0075875 A1 | 3/2020 | Vasen et al. |
| 2021/0057419 A1 | 2/2021 | Shin et al. |

\* cited by examiner

METHODS OF MANUFACTURING A FIELD EFFECT TRANSISTOR USING CARBON NANOTUBES AND FIELD EFFECT TRANSISTORS

BACKGROUND

As the semiconductor industry has progressed into nanometer technology process nodes in pursuit of higher device density, higher performance, and lower costs, challenges from both fabrication and design issues have resulted in the development of three-dimensional designs, such as GAA structures. Non-Si based low-dimensional materials are promising candidates to provide superior electrostatics (e.g., for short-channel effect) and higher performance (e.g., less surface scattering). Carbon nanotubes (CNTs) are considered one such promising candidate due to their high carrier mobility and substantially one dimensional structure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
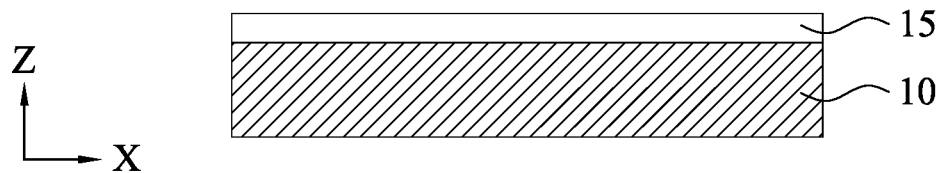
FIGS. 1A, 1B, 1C, 1D, 1E and 1F illustrate various stages of a sequential fabrication process of a GAA FET in accordance with an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanied drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of" Further, in the following fabrication process, there may be one or more additional operations in/between the described operations, and the order of operations may be changed. In the present disclosure, a phrase "one of A, B and C" means "A, B and/or C" (A, B, C, A and B, A and C, B and C, or A, B and C), and does not mean one element from A, one element from B and one element from C, unless otherwise described.

Carbon nanotubes (CNTs) having diameters in the order of nm (e.g., about 1 nm) are considered a material of choice for making the ultimate scaled FET device due to their cylindrical geometry, excellent electrical and mechanical properties. A field effect transistor (FET) using a CNT with a gate length about 10 nm or less shows excellent electrical characteristics. However, a fabrication technology compatible with a CMOS fabrication technology has not been established. In the present disclosure, by stacking layers of aligned CNTs on a substrate and forming a fin structure from the stacked CNTs, a horizontal gate all around process flow compatible with a CMOS technology is provided.

In some embodiments, semiconductor devices include a novel structure of field-effect transistors including stacked, gate-all-around (GAA) carbon nanotubes (CNTs). The semiconductor devices include an array of aligned CNTs with a gate dielectric layer wrapping therearound and a gate electrode layer. The GAA FETs with CNTs can be applied to logic circuits in advanced technology node. However, fabricating CNT-based devices has led to problems, such as difficulty in increasing CNT density to obtain higher current, preventing inter-tube interactions that degrade CNT performance in a CNT bundle structure, and/or lack of a feasible fabrication process to integrate high-density GAA CNTs into a circuit. The following embodiments provide a GAA FET using CNTs and its manufacturing process that can resolve these problems.

FIGS. 1A-15B illustrate various stages of a sequential fabrication process of a GAA FET using carbon nanotubes in accordance with embodiments of the present disclosure. It is understood that additional operations can be provided before, during, and after processes shown by FIGS. 1A-15B, and some of the operations described below can be replaced or eliminated, for additional embodiments of the method. The order of the operations/processes may be interchangeable.

As shown in FIG. 1A, a bottom support layer 15 is formed over a substrate 10. In some embodiments, the substrate 10 is made of a suitable elemental semiconductor, such as silicon, diamond or germanium; a suitable alloy or compound semiconductor, such as Group-IV compound semiconductors (e.g., silicon germanium (SiGe), silicon carbide (SiC), silicon germanium carbide (SiGeC), GeSn, SiSn, SiGeSn), Group III-V compound semiconductors (e.g., gallium arsenide, indium gallium arsenide (InGaAs), indium arsenide, indium phosphide, indium antimonide, gallium arsenic phosphide, or gallium indium phosphide), or the like. An insulating material, such as a glass, may be used as the substrate. The bottom support layer 15 is made of an insulating material in some embodiments. In some embodiments, the bottom support layer includes one or more layers of silicon oxide, silicon nitride, SiON, SiOC, SiOCN and SiCN, or other suitable insulating material. In other embodiments, the bottom support layer includes a polycrystalline or amorphous material of one of Si, Ge and SiGe. The bottom support layer 15 can be formed by suitable film formation methods, such as thermal oxidation, chemical vapor deposition (CVD), physical vapor deposition (PVD) or atomic layer deposition (ALD). In certain embodiments, silicon oxide (e.g., $SiO_2$) is used as the bottom support layer 15.

Figure 1B:
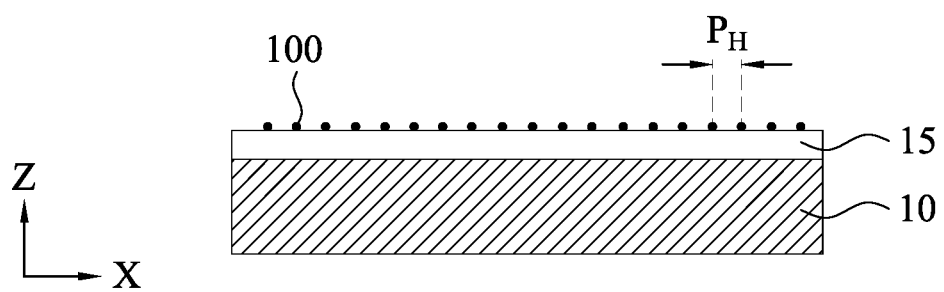

Then, as shown in FIG. 1B, one or more carbon nanotubes (CNTs) 100 are arranged over the bottom support layer 15. In some embodiments, the bottom support layer is not used and the CNTs 100 are directly disposed on the substrate 10. The CNTs are arranged on the bottom support layer 15 aligned with the substantially same direction (e.g., Y direction). The deviation from the Y direction of the alignment of the CNTs 100 is about ±10 degrees in some embodiments, and is about ±5 degrees in other embodiments. In certain embodiments, the deviation is about ±2 degrees. The CNTs 100 are arranged with a density in a range from about 50 tubes/μm to about 300 tubes/μm in some embodiments, and in other embodiments, the density is in a range from about 100 tubes/μm to about 200 tubes/μm. The length of the CNTs 100 (in the Y direction) is in a range from about 0.5 μm to about 5 μm in some embodiments, and is in a range from about 1 μm to about 2 μm in other embodiments. The average diameter of the CNTs 100 is in a range from about 1.0 nm to about 2.0 nm in some embodiments.

Carbon nanotubes can be formed by various methods, such as arc-discharge or laser ablation methods. The formed CNTs are dispersed in a solvent, such as sodium dodecyl sulfate (SDS). The CNTs can also be formed through chemical vapor deposition ("CVD") on a quartz or sapphire substrate. The CNTs can be transferred to and disposed on another substrate using various methods, such as a floating evaporative self-assembly method in some embodiments.

Figure 1C:
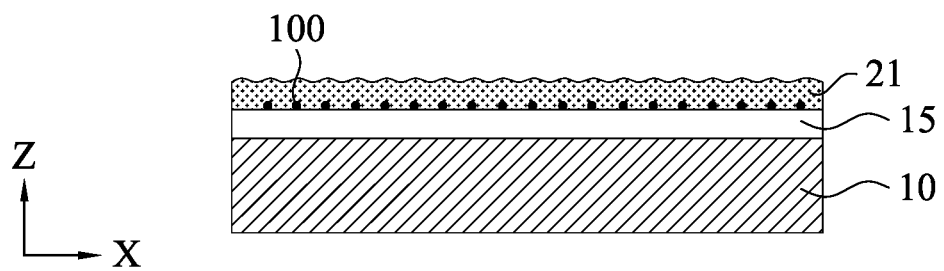

After the CNTs 100 are transferred onto the bottom support layer 15, a first support layer 21 is formed over the CNTs (a first group of CNTs) disposed on the bottom support layer 15, as shown in FIG. 1C. In some embodiments, the first support layer 21 includes a polycrystalline or amorphous material of one of Si, Ge and SiGe. In other embodiments, the first support layer 21 includes one or more layers of silicon oxide, silicon nitride, SiON, SiOC, SiOCN and SiCN, or other suitable insulating material. In some embodiments, the first support layer 21 includes organic material, such as organic polymers. In certain embodiments, the first support layer 21 is made of a different material than the bottom support layer 15. In other embodiments, the first support layer 21 is made of the same material as the bottom support layer 15. The first support layer 21 can be formed by suitable film formation methods, such as CVD, PVD or ALD. In one embodiment, ALD is used for its high thickness uniformity and thickness controllability.

In some embodiments, as shown in FIG. 1C, when the first support layer is conformally formed over the first group of CNTs 100, the upper surface of the first support layer has a wavy shape having peaks and valleys. The thickness of the first support layer 21 is in a range from about 2 nm to about 10 nm in some embodiments, and is in a range from about 3 nm to 5 nm in other embodiments.

Then, a second support layer 22 is formed over the first support layer 21. In some embodiments, the second support layer 22 is made of the same material as the first support layer in some embodiments. The thickness of the second support layer 22 is substantially the same as the thickness of the first support layer 21. The difference in the thickness is within ±5% in some embodiments with respect to the average thickness.

Further, a second group of CNTs 100 are disposed on the second support layer 22. When the upper surface of the first support layer has the wavy shape as shown in FIG. 1C, the second group of CNTs 100 tend to be arranged at the valleys of the wavy shape.

Figure 1D:
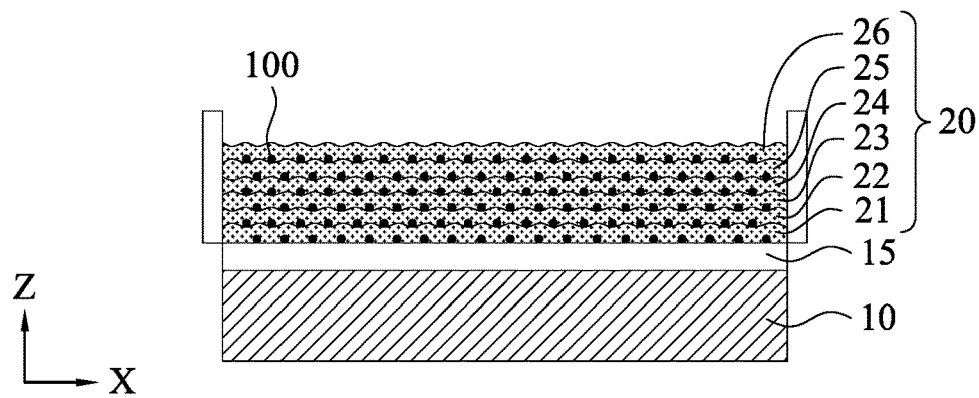

In some embodiments, forming a group of CNTs and forming a support layer are repeated to form n support layers in each of which CNT's are embedded, where n is integer of three or more. In some embodiments, n is up to 20. FIG. 1D shows one embodiment, in which six support layers 21, 22, 23, 24, 25 and 26 are formed, thus forming six layers of CNTs disposed in a support layer 20. In the following explanation, the first to sixth support layers 21-26 are referred to as a support layer 20.

Figure 1E:
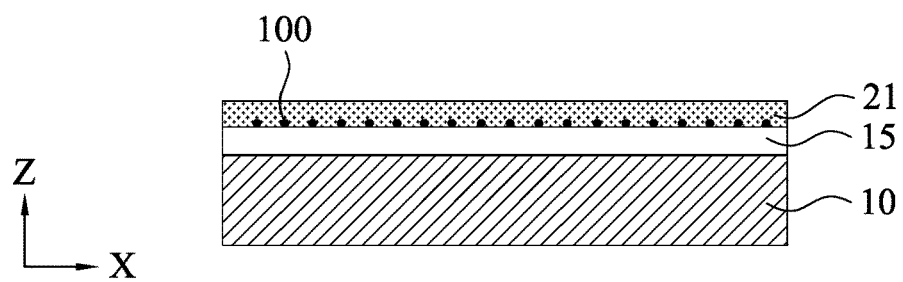

In other embodiments, as shown in FIG. 1E, after the first support layer 21 is formed with the wavy upper surface, one or more planarization operations are performed to flatten the upper surface of the support layer 21. The planarization operation includes an etch-back process or a chemical mechanical polishing (CMP) process. In one embodiment, CMP is used.

Then, as set forth above, the second group of CNTs 100 and the second support layer 22 are formed on the flattened first support layer 21. The process is repeated to obtain the structure shown in FIG. 1F.

Figure 1F:
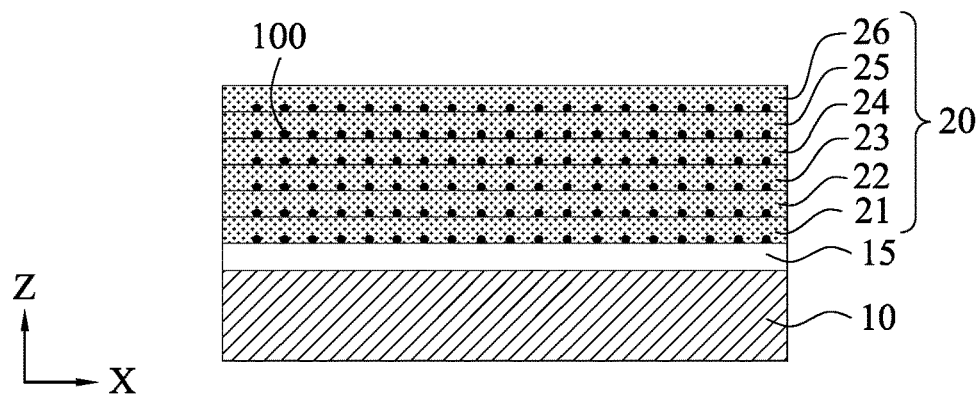

In FIGS. 1D and 1F, the CNT's in one layer are arranged in a constant pitch and the CNT's in the vertical direction are aligned. However, the arrangement of the CNTs in the support layer 20 is not limited to those of FIGS. 1D and 1F. In some embodiments, the CNTs in one layer have random pitch in the X direction. When the average diameter of the CNTs 100 is $D_{CNT}$, horizontal pitch $P_H$ of the CNTs is $D_{CNT} \leq P_H \leq 10 \times D_{CNT}$, in some embodiments. In some embodiments, two adjacent CNTs are in contact with each other. Further, in the vertical direction, at least two CNTs 100 in different layers are not aligned with each other, in some embodiments. The vertical pitch $P_V$ of the CNTs 100 (See FIG. 4C) is determined by the thickness of the support layers. In some embodiments, a vertical pitch $P_V$ of the CNTs 100 in adjacent layers is $0.9 \times P_A \leq P_V \leq 1.1 \times P_A$, where $P_A$ is an average pitch of the multiple layers. In other embodiments, the vertical pitch $P_V$ is $0.95 \times P_A \leq P_V \leq 1.05 \times P_A$.

Figure 2A:
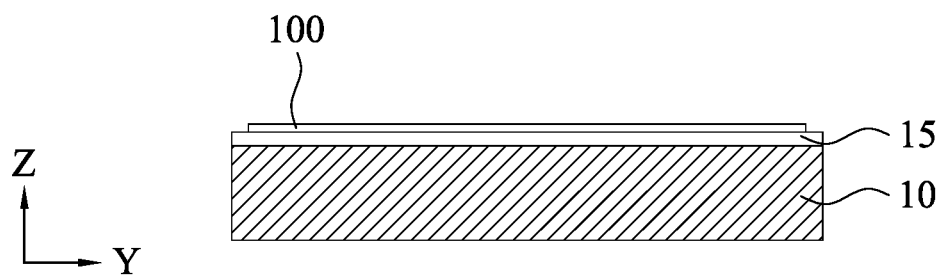
FIGS. 2A, 2B, 2C, 2D and 2E illustrate various stages of a sequential fabrication process of a GAA FET in accordance with an embodiment of the present disclosure.
Figure 2B:
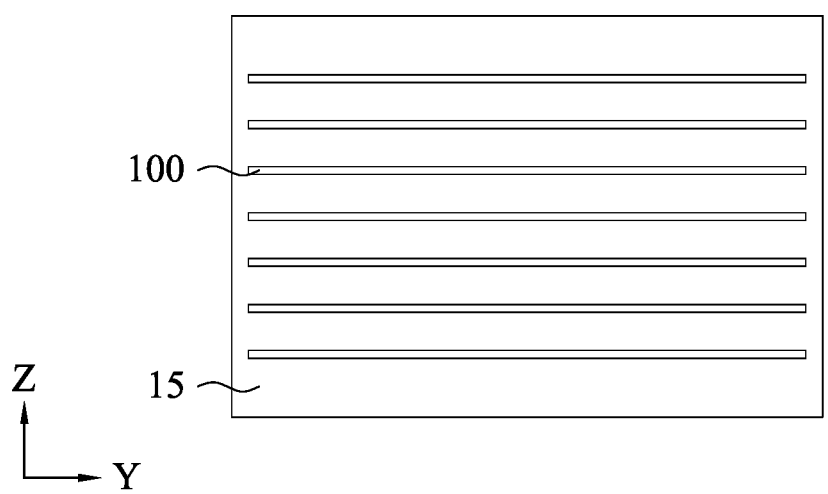
Figure 2C:
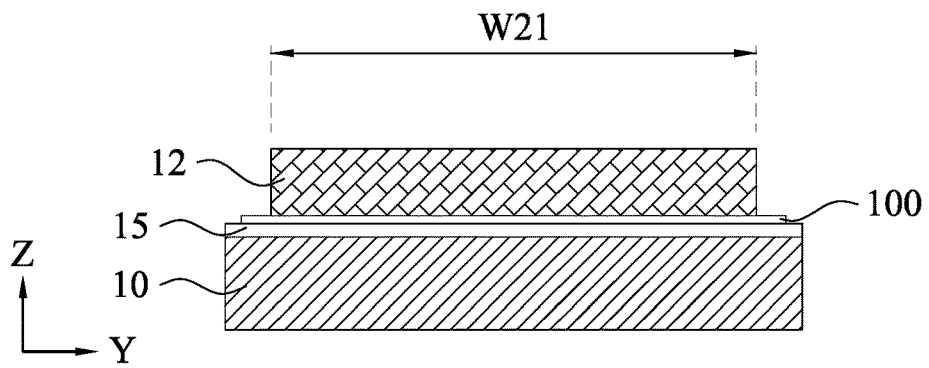
Figure 2D:
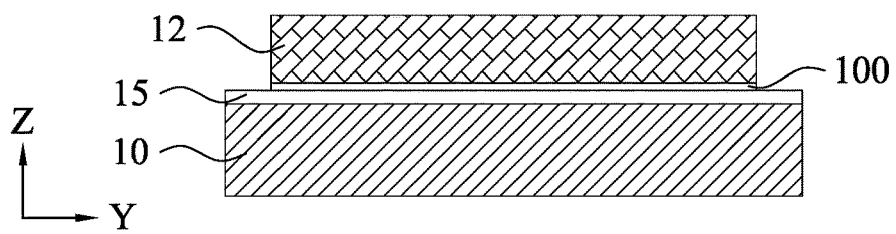
Figure 2E:
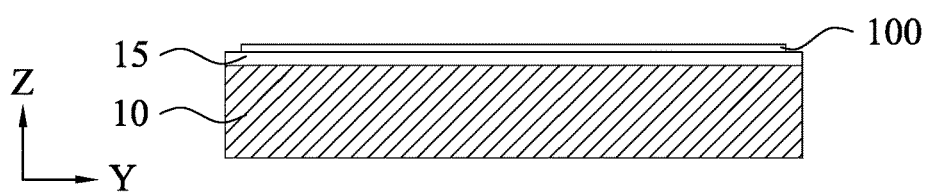

In some embodiments, after the CNTs 100 are transferred over the substrate 10, a trimming process as shown in FIGS. 2A-2E is performed. After the CNTs 100 are transferred onto the bottom support layer 15 as shown in FIGS. 2A and 2B, by using a lithography operation, a photo resist pattern 12, as a cover layer, is formed over a center part of the CNTs 100. End portions of the CNTs 100 are exposed, as shown in FIG. 2C. The width W21 of the photo resist pattern 12 is in a range from about 50 nm to about 2000 nm in some embodiments, and is in a range from about 100 nm to about 1000 nm in other embodiments. Then, the exposed end portions of the CNTs 100 are removed by etching, as shown in FIG. 2D. Further, as shown in FIG. 2E, the resist pattern 12 is then removed by dry etching and/or wet removal using an organic solvent.

Figure 3A:
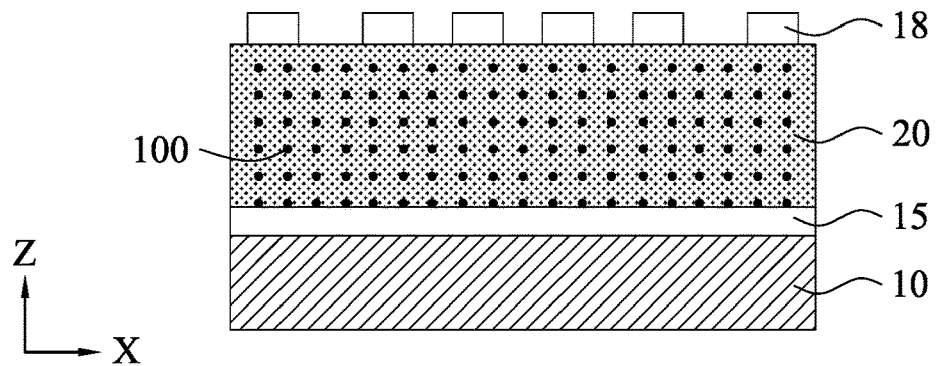
FIGS. 3A, 3B and 3C illustrate various stages of a sequential fabrication process of a GAA FET in accordance with an embodiment of the present disclosure.
Figure 3B:
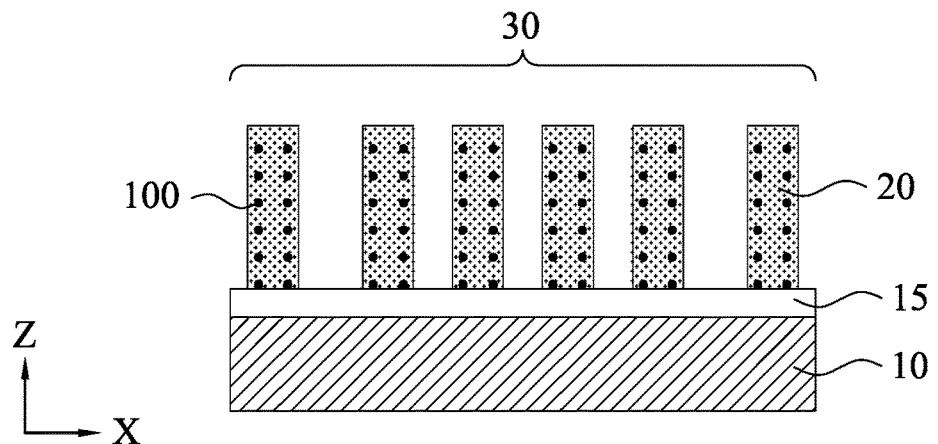

Adverting to FIGS. 3A and 3B, by using one or more lithography and etching operations, a mask pattern 18 is formed over the support layer 20 and the support layer 20 with the CNTs 100 is patterned into one or more fin structures 30. The mask pattern 18 is a photo resist layer in some embodiments, and can be a hard mask made of dielectric material in other embodiments. In some embodiments, the fin structures 30 may be patterned by any suitable method. For example, the fin structures may be patterned using one or more photolithography processes, including extreme ultraviolet (EUV) lithography, double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin structures.

Figure 3C:
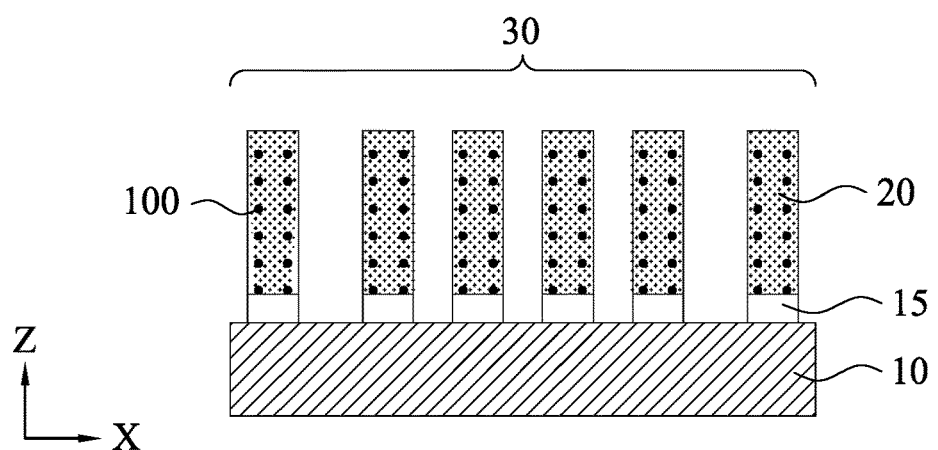

In some embodiments, the width of the fin structures 30 in the X direction is in a range from about 5 nm to about 20 nm, and is in a range from about 7 nm to about 12 nm in other embodiments. In FIG. 3B, the bottom support layer 15 is made of a different material than the support layers 20 and thus the bottom support layer 15 is not patterned. In FIG. 3C, the bottom support layer 15 is made of the same material as or similar material the support layers 20 and thus the bottom support layer 15 is also patterned into fin structure.

The total number of the CNTs 100 per fin structure is in a range from about 5 to about 100 in some embodiments, and is in a range from about 10 about 50 in other embodiments. In each support layer contained in a fin structure, the number of CNTs 100 may vary in a range between 1 CNT 100 to 15 CNT 100 depending on device design and configurations. In an embodiment, each support layer in a fin structure includes 3 CNT 100.

Figure 4A:
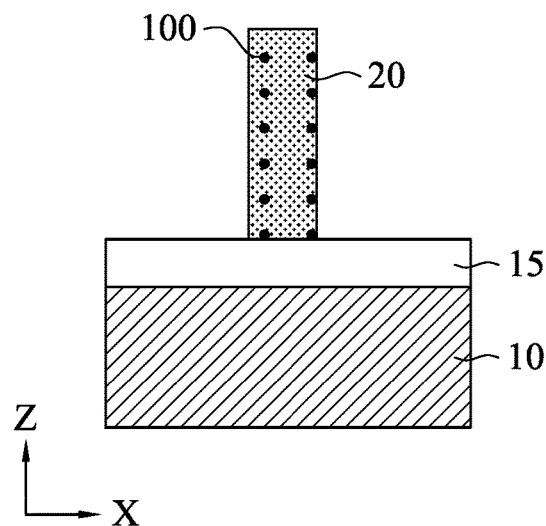
FIGS. 4A, 4B, 4C and 4D illustrate various stages of a sequential fabrication process of a GAA FET in accordance with an embodiment of the present disclosure.
Figure 4B:
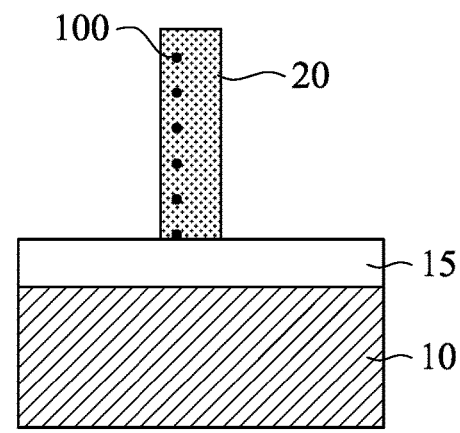

FIGS. 4A-4D show various configurations of CNT's in one fin structure 30. As shown in FIG. 4A, the CNTs 100 are partially exposed at the side surface of the support layer 20 in some embodiments. In such a case, a removal operation is performed to remove the partially exposed CNTs as shown in FIG. 4B. The removal operation can be a plasma treatment using oxygen containing gas.

Figure 4C:
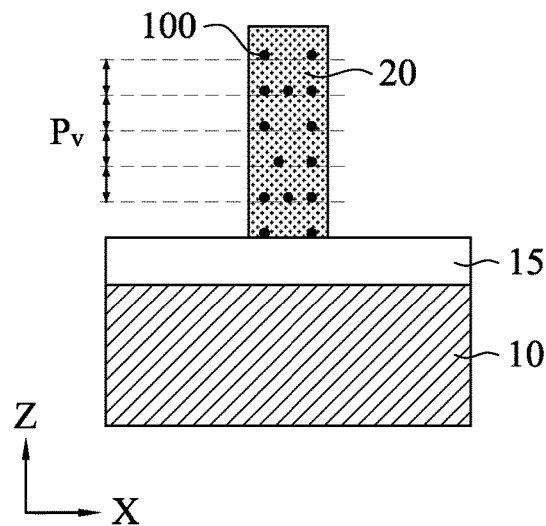
Figure 4D:
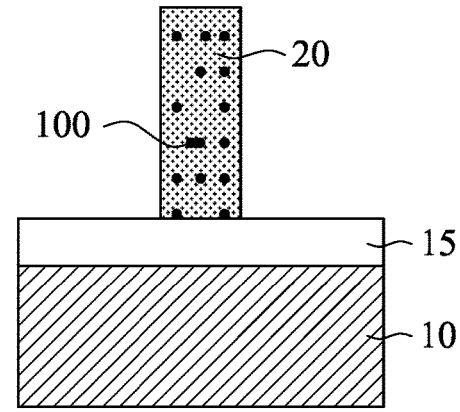

In some embodiments, as shown in FIGS. 4C and 4D, the number of CNTs 100 in one layer is different from another layer. Further, the pitch of the CNTs in one layer is different from the pitch of CNTs 100 in another layer in some embodiments. The pitch of CNTs 100 may vary within one layer in some embodiments. As shown in FIG. 4D, adjacent CNTs 100 in one layer are in contact with each other in some embodiments, and in certain embodiments, no CNT's in another layer are in contact with each other. No CNT is in contact with another CNT in the vertical direction in some embodiments.

Figure 5A:
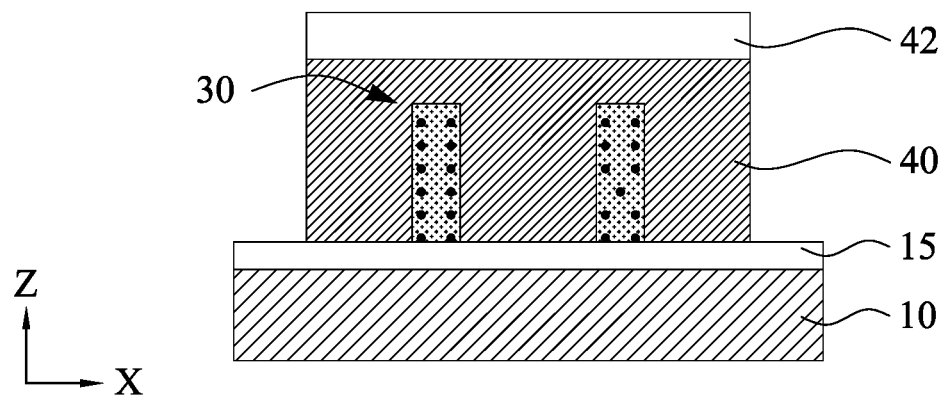
FIGS. 5A and 5B illustrate various stages of a sequential fabrication process of a GAA FET in accordance with an embodiment of the present disclosure.
Figure 5B:
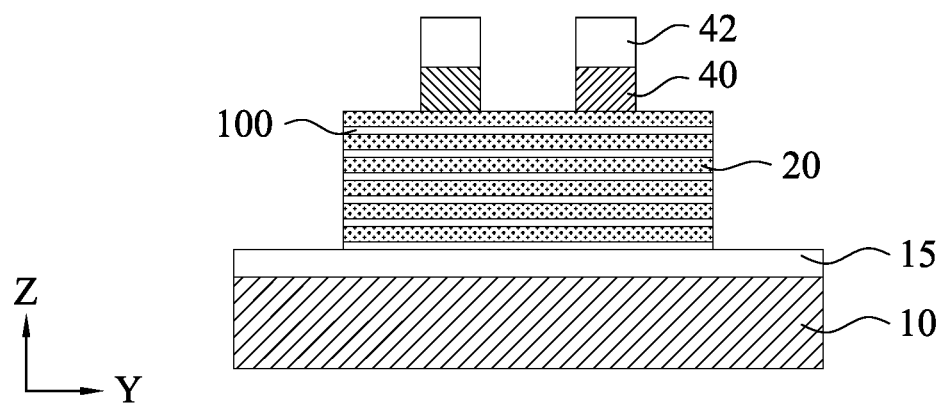

Subsequently, a sacrificial gate structure 40 is formed over the fin structures 30 as shown in FIGS. 5A and 5B. FIG. 5A is a cross sectional view along the X direction and the FIG. 5B is a cross sectional view along the Y direction. The sacrificial gate structure 40 is formed by blanket depositing a sacrificial gate electrode layer over the fin structures 30 such that the fin structures 30 are fully embedded in the sacrificial gate electrode layer. The sacrificial gate electrode layer includes silicon, germanium or silicon germanium, such as polycrystalline silicon or amorphous silicon. The thickness of the sacrificial gate electrode layer is in a range from about 100 nm to about 200 nm in some embodiments. In some embodiments, the sacrificial gate electrode layer is subjected to a planarization operation. The sacrificial gate electrode layer is deposited using CVD, including LPCVD and PECVD, PVD, ALD, or other suitable process. In some embodiments, no sacrificial gate dielectric layer is formed between the fin structure 30 and the sacrificial gate electrode layer, and in other embodiments, a sacrificial gate dielectric layer is formed between the fin structure 30 and the sacrificial gate electrode layer.

Subsequently, a mask layer 42 is formed over the sacrificial gate electrode layer 40. The mask layer 42 includes one or more of a silicon nitride (SiN) layer, a silicon oxide layer or other suitable hard mask layers. Next, a patterning operation is performed on the mask layer and sacrificial gate electrode layer is patterned into the sacrificial gate structure 40, as shown in FIGS. 5A and 5B. By patterning the sacrificial gate structure, the fin structures 30 are partially exposed on opposite sides of the sacrificial gate structure 40, thereby defining source/drain (S/D) regions, as shown in FIG. 5B. In an embodiment, a source and a drain are interchangeably used and the structures thereof are substantially the same. In FIGS. 5A and 5B, two sacrificial gate structures 40 are formed over two fin structures 30, but the number of the sacrificial gate structures is not limited to this configuration. One or more than two sacrificial gate structures can be arranged in the Y direction in some embodiments. In certain embodiments, one or more dummy sacrificial gate structures are formed on both sides of the sacrificial gate structures to improve pattern fidelity.

Figure 6A:
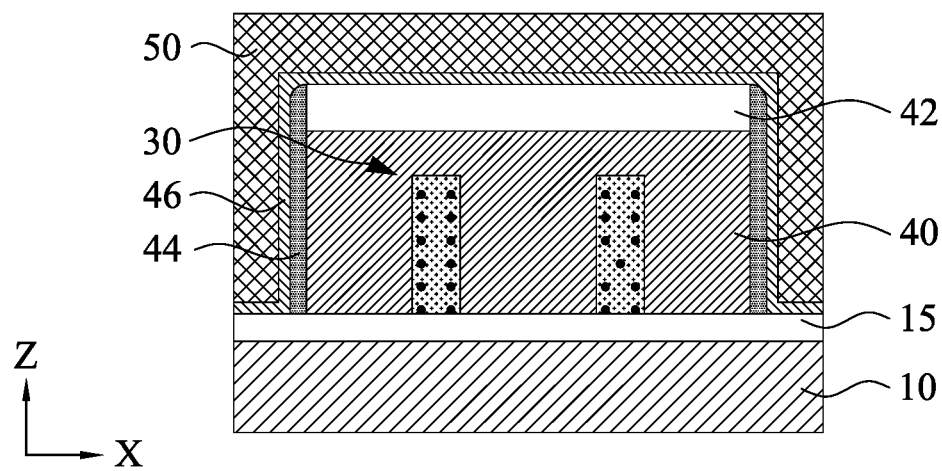
FIGS. 6A and 6B illustrate various stages of a sequential fabrication process of a GAA FET in accordance with an embodiment of the present disclosure.
Figure 6B:
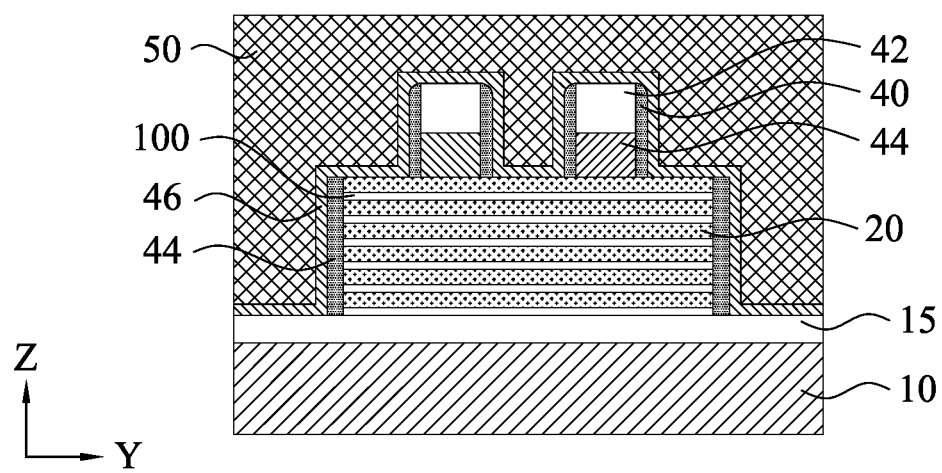

After the sacrificial gate structure 40 is formed, a blanket layer of an insulating material for gate outer spacers 44 is conformally formed by using CVD or other suitable methods, as shown in FIGS. 6A and 6B. The blanket layer is deposited in a conformal manner so that it is formed to have substantially equal thicknesses on vertical surfaces, such as the sidewalls, horizontal surfaces, and the top of the sacrificial gate structures 40. In some embodiments, the blanket layer is deposited to a thickness in a range from about 2 nm to about 10 nm. In some embodiments, the insulating material of the blanket layer is a silicon nitride-based material, such as SiN, SiON, SiOCN or SiCN and combinations thereof. In certain embodiments, the insulating material is one of SiOC, SiCON and SiCN. As understood from FIGS. 5B and 6B, in some embodiments, the CNTs 100 are supported by the support layer 20 but are not supported (anchored) by the outer spacers 44. In some embodiments, before the blanket layer for the outer spacers 44 is formed, the support layer 20 is slightly etched to expose the ends of the CNTs 100. In such a case, the ends of the CNTs 100 are supported (anchored) by the outer spacers 44.

Further, as shown in FIGS. 6A and 6B, the gate outer spacers 44 are formed on opposite sidewalls of the sacrificial gate structures 40 by anisotropic etching. After the blanket layer is formed, anisotropic etching is performed on the blanket layer using, for example, reactive ion etching (RIE). During the anisotropic etching process, most of the insulating material is removed from horizontal surfaces, leaving the dielectric spacer layer on the vertical surfaces, such as the sidewalls of the sacrificial gate structures and the sidewalls of the exposed fin structures. The mask layer 42 may be exposed from the outer spacers. In some embodiments, an isotropic etching process may be subsequently performed to remove the insulating material from the upper portions of the S/D region of the exposed fin structures 30.

Subsequently, a liner layer 46, such as an etch stop layer, is optionally formed to cover the gate structures 40 with the outer spacer 44 and the exposed fin structures 30. In some embodiments, the liner layer 46 includes a silicon nitride-based material, such as silicon nitride, SiON, SiOCN or SiCN and combinations thereof, formed by CVD, including LPCVD and PECVD, PVD, ALD, or other suitable process. In certain embodiments, the liner layer 46 is made of silicon nitride. Further, as shown in FIGS. 6A and 6B, a first interlayer dielectric (ILD) layer 50 is formed. The materials for the first ILD layer 50 include compounds comprising Si, O, C and/or H, such as silicon oxide, SiCOH and SiOC. Organic materials, such as polymers, may be used for the first ILD layer 50.

Figure 7A:
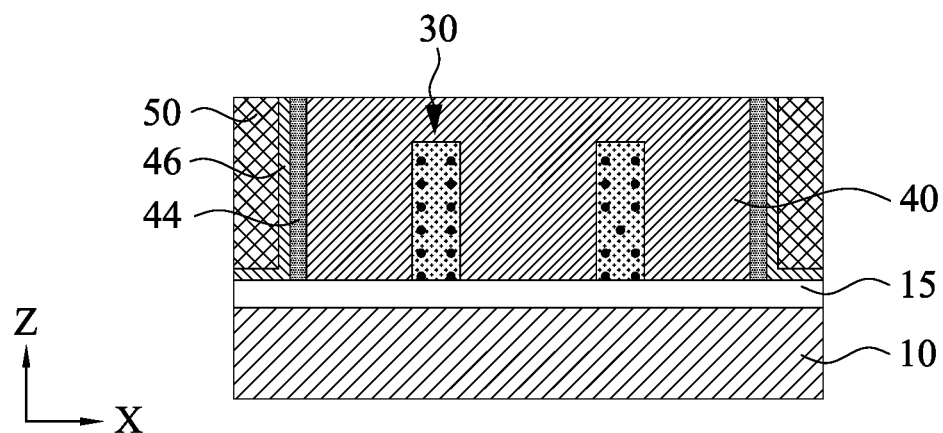
FIGS. 7A and 7B illustrate various stages of a sequential fabrication process of a GAA FET in accordance with an embodiment of the present disclosure.
Figure 7B:
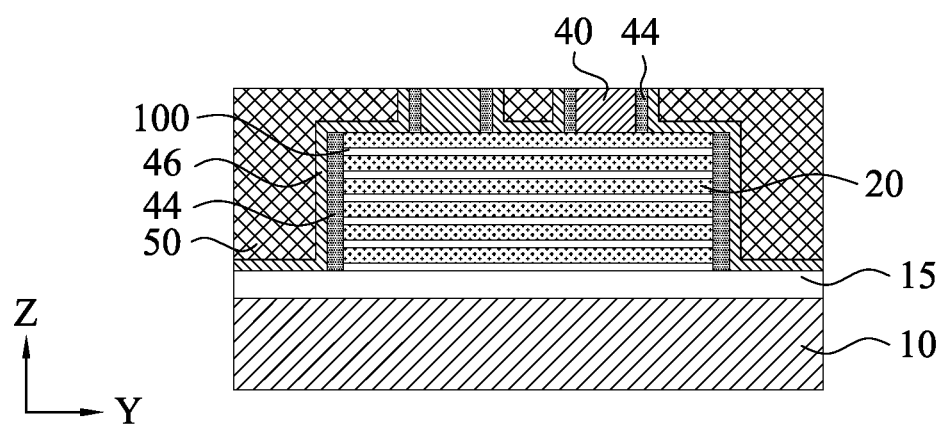
Figure 8A:
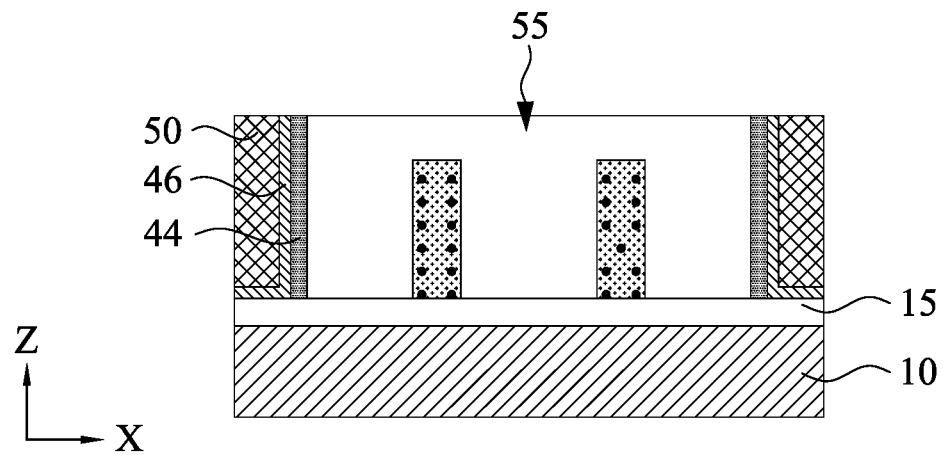
FIGS. 8A and 8B illustrate various stages of a sequential fabrication process of a GAA FET in accordance with an embodiment of the present disclosure.
Figure 8B:
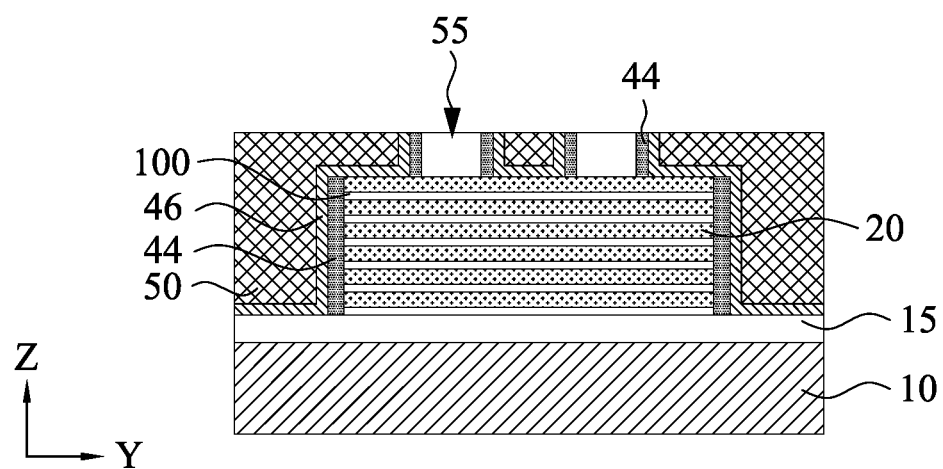

After the first ILD layer 50 is formed, a planarization operation, such as CMP, is performed, so that the sacrificial gate electrode layer 40 is exposed, as shown in FIGS. 7A and 7B. Then, as shown in FIGS. 8A and 8B, the sacrificial gate electrode layer 40 is removed, thereby exposing a channel region of the fin structures in a gate space 55. The sacrificial gate structure 40 can be removed using plasma dry etching and/or wet etching. When the sacrificial gate electrode layer 40 is polysilicon and the first ILD layer 50 is silicon oxide, a wet etchant such as a TMAH solution can be used to selectively remove the sacrificial gate electrode layer 40.

Figure 9A:
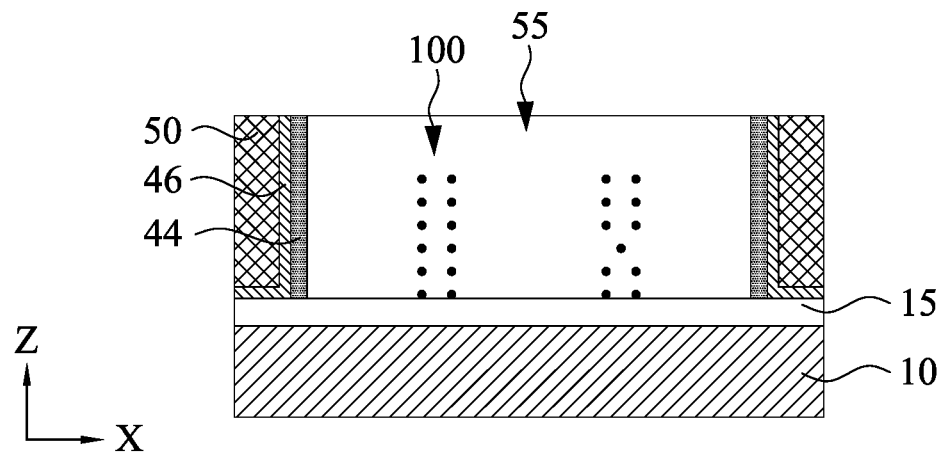
FIGS. 9A, 9B and 9C illustrate various stages of a sequential fabrication process of a GAA FET in accordance with an embodiment of the present disclosure.
Figure 9B:
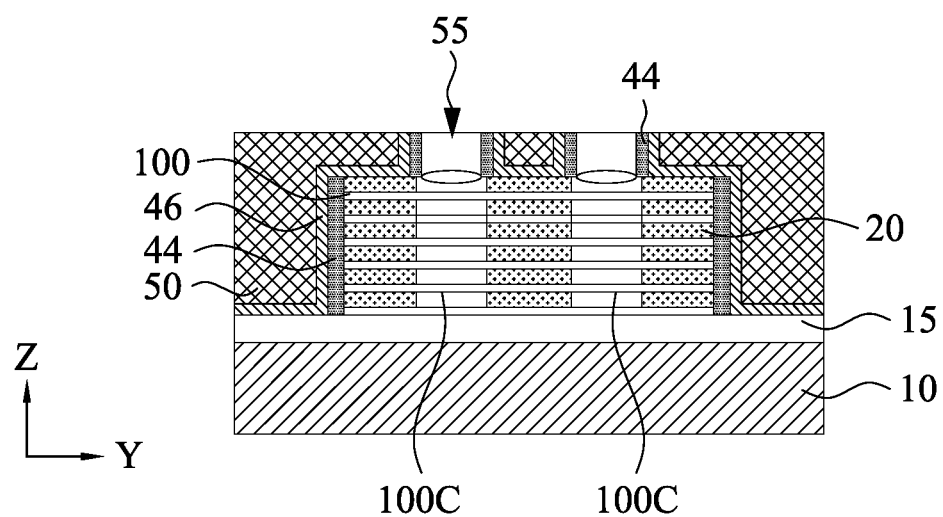
Figure 9C:
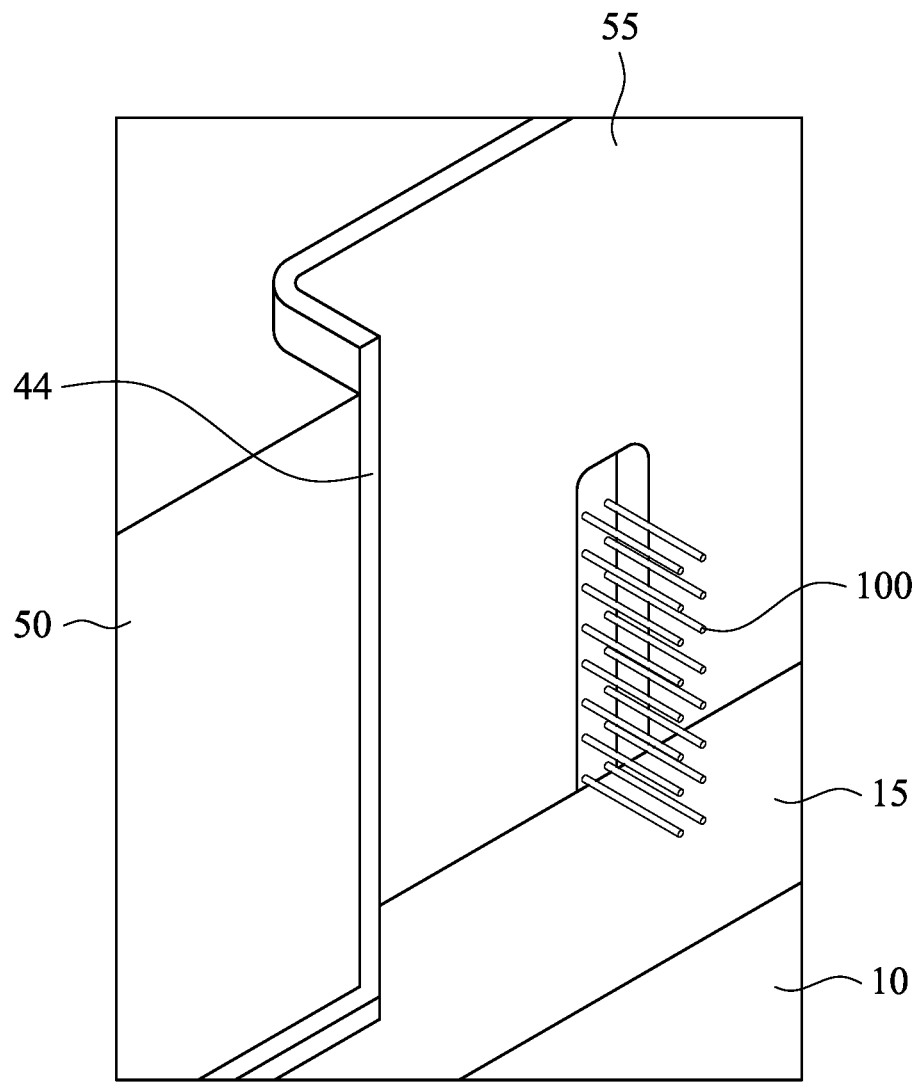

Further, as shown in FIGS. 9A-9C, the support layer 20 in the gate space 55 is removed to release the CNTs 100. FIG. 9C is an isometric view. The support layer 20 can be removed selectively to release the CNTs 100 using plasma dry etching and/or wet etching. When the support layer 20 is polysilicon or amorphous silicon and the first ILD layer 50 is silicon oxide, a wet etchant such as a TMAH solution is used. When the sacrificial gate electrode layer 40 and the support layer 20 are made of the same material, the removal of the sacrificial gate electrode layer 40 and the removal of the support layer 20 are performed by the same etching operation.

Figure 10A:
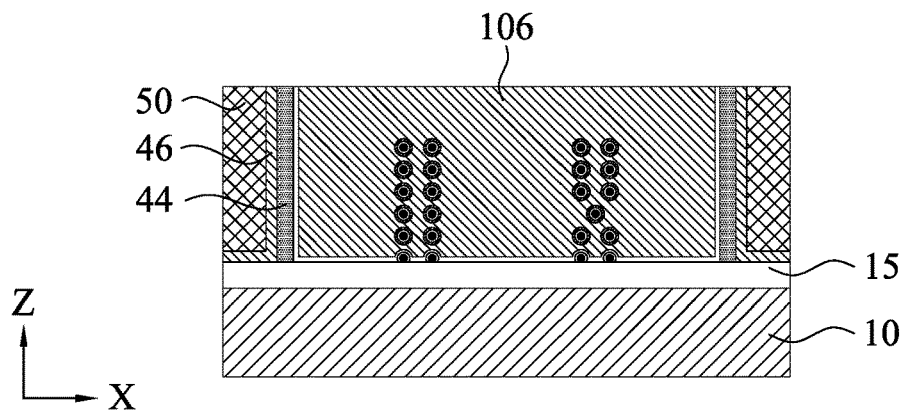
FIGS. 10A, 10B and 10C illustrate various stages of a sequential fabrication process of a GAA FET in accordance with an embodiment of the present disclosure.
Figure 10B:
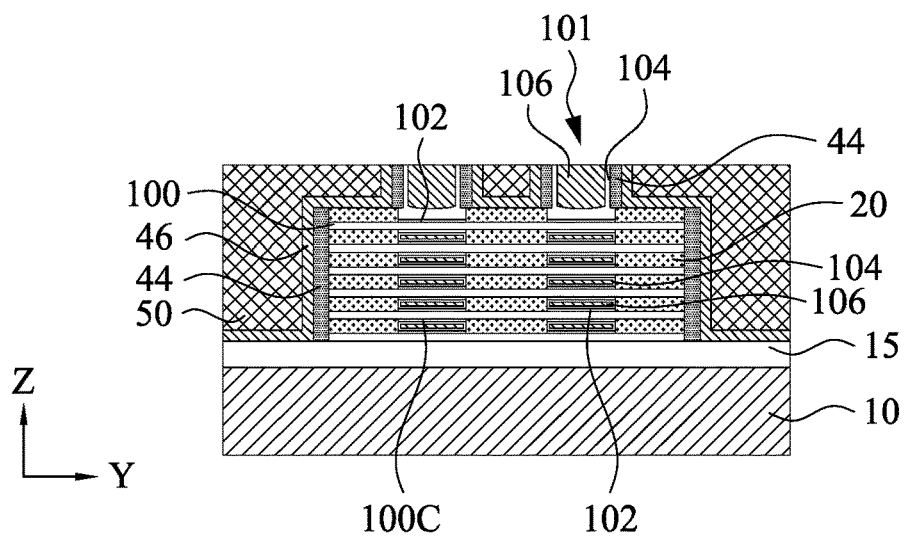
Figure 10C:
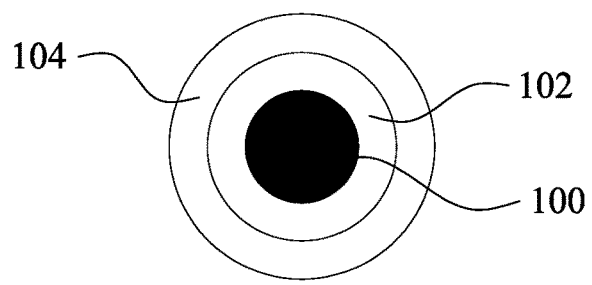

After the channel regions 100C of the CNTs 100 are released, a gate structure 101 is formed wrapping around the channel regions 100C. Specifically, a gate dielectric layer 102 is formed around the CNTs 100, as shown in FIGS. 10A-10C. FIG. 10C is an enlarged view of the gate structure. In some embodiments, the gate dielectric layer 102 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HMO, HfSiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 102 is made of $HfO_2$ for an n-channel FET, and is made of $Al_2O_3$ for a p-channel FET. The gate dielectric layer 102 has a thickness in a range from about 0.5 nm to about 2.5 nm in some embodiments, and has a thickness in a range from about 1.0 nm to about 2.0 nm in other embodiments. The gate dielectric layer 102 may be formed by CVD, ALD or any suitable method. In one embodiment, the gate dielectric layer 102 is formed using a highly conformal deposition process such as ALD in order to ensure the formation of a gate dielectric layer having a uniform thickness around each channel region of the CNTs 100.

In some embodiments, an interfacial layer (not shown) is formed around the CNTs before the gate dielectric layer 102 is formed. The interfacial layer is made of, for example, $SiO_2$ and has a thickness in a range from about 0.5 nm to about 1.5 nm in some embodiments. In other embodiments, the thickness of the interfacial layer is in a range from about 0.6 nm to about 1.0 nm.

In certain embodiments, one or more work function adjustment layers 104 are formed on the gate dielectric layer 102. The work function adjustment layers 104 are made of a conductive material such as a single layer of TiN, TaN, TaAlC, TiC, TaC, Co, Al, TiAl, HfTi, TiSi, TaSi or TiAlC, or a multilayer of two or more of these materials. In certain embodiments, TiN is used as the work function adjustment layer 104. The work function adjustment layer 104 may be formed by ALD, PVD, CVD, e-beam evaporation, or other suitable process. Further, the work function adjustment layer 104 may be formed separately for the n-channel FET and the p-channel FET which may use different metal layers.

Then, as shown in FIGS. 10A and 10B, a gate electrode layer 106 is formed over the work function adjustment layer 104. The gate electrode layer 106 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The work function adjustment layer 104 has a thickness in a range from about 0.5 nm to about 5.0 nm in some embodiments, and has a thickness in a range from about 0.8 nm to about 1.5 nm in other embodiments. The gate electrode layer 106 may be formed by CVD, ALD, electro-plating, or other suitable method. The gate electrode layer 106 is also deposited over the upper surface of the first ILD layer 50, and the gate dielectric layer 102, the work function adjustment layer 104 and the gate electrode layer 106 formed over the first ILD layer 50 are then planarized by using, for example, CMP, until the first ILD layer 50 is revealed.

In FIGS. 10A and 10B, the gate dielectric layer fully wraps around each of the CNTs 100 and the work function adjustment layer 104 also fully wraps around each of the CNTs 100. In some embodiments, spaces are formed between the work function adjustment layer 104 of adjacent CNTs 100 and the spaces are filled by the gate electrode layer 106.

Figure 11A:
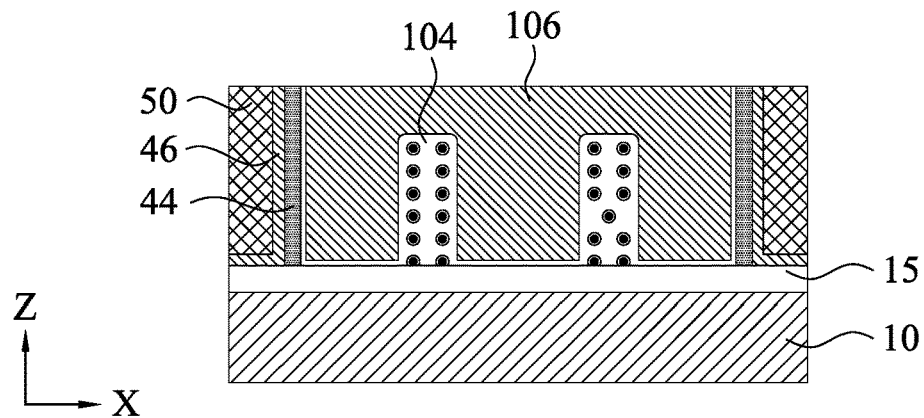
FIGS. 11A and 11B illustrate various stages of a sequential fabrication process of a GAA FET in accordance with an embodiment of the present disclosure.
Figure 11B:
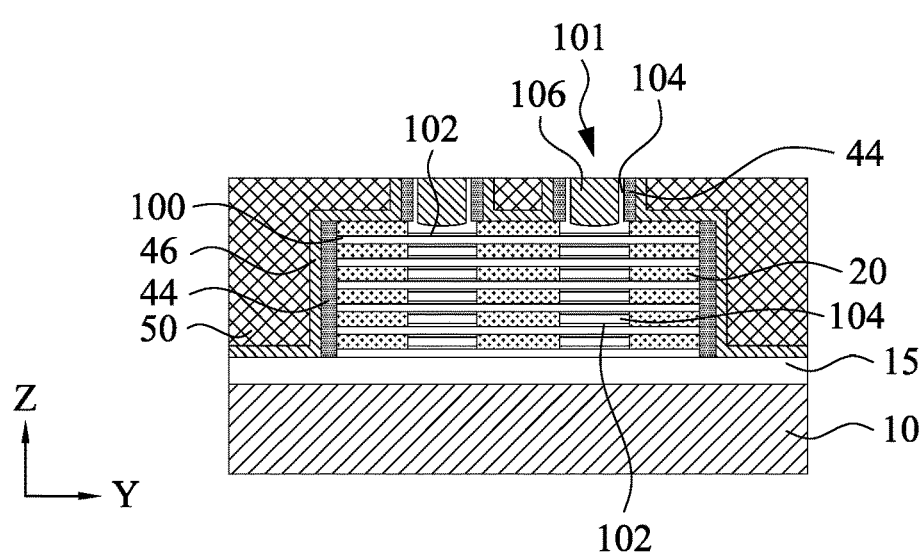

In other embodiments, as shown in FIGS. 11A and 11B, the work function adjustment layer 104 fills spaces between the gate dielectric layer 102 of adjacent CNTs 100, and the gate electrode layer 106 covers outer surface of the work function adjustment layer 104.

Figure 12A:
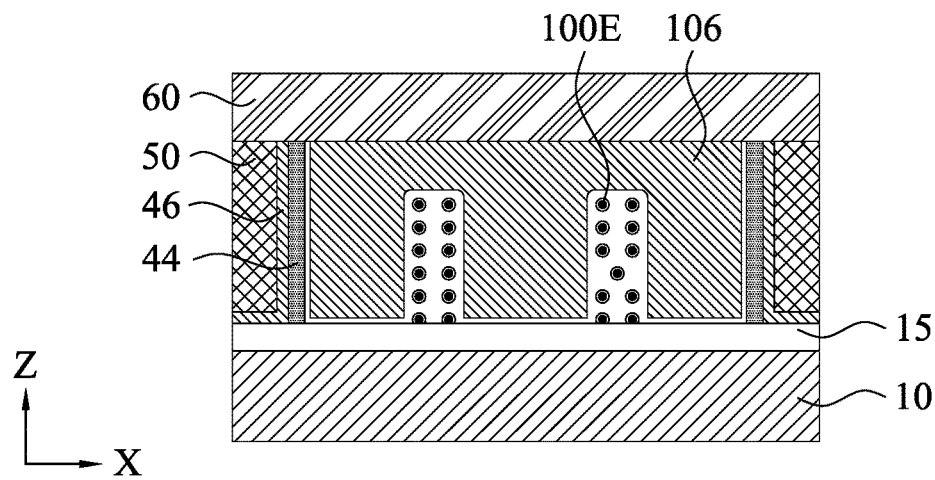
FIGS. 12A, 12B, 12C, 12D and 12E illustrate various stages of a sequential fabrication process of a GAA FET in accordance with an embodiment of the present disclosure.
Figure 12B:
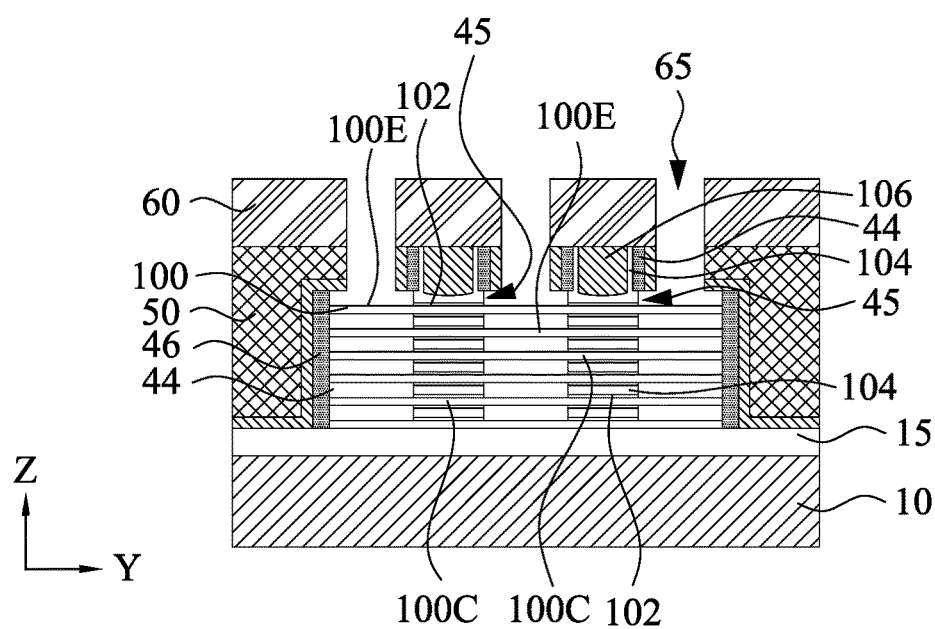
Figure 12C:
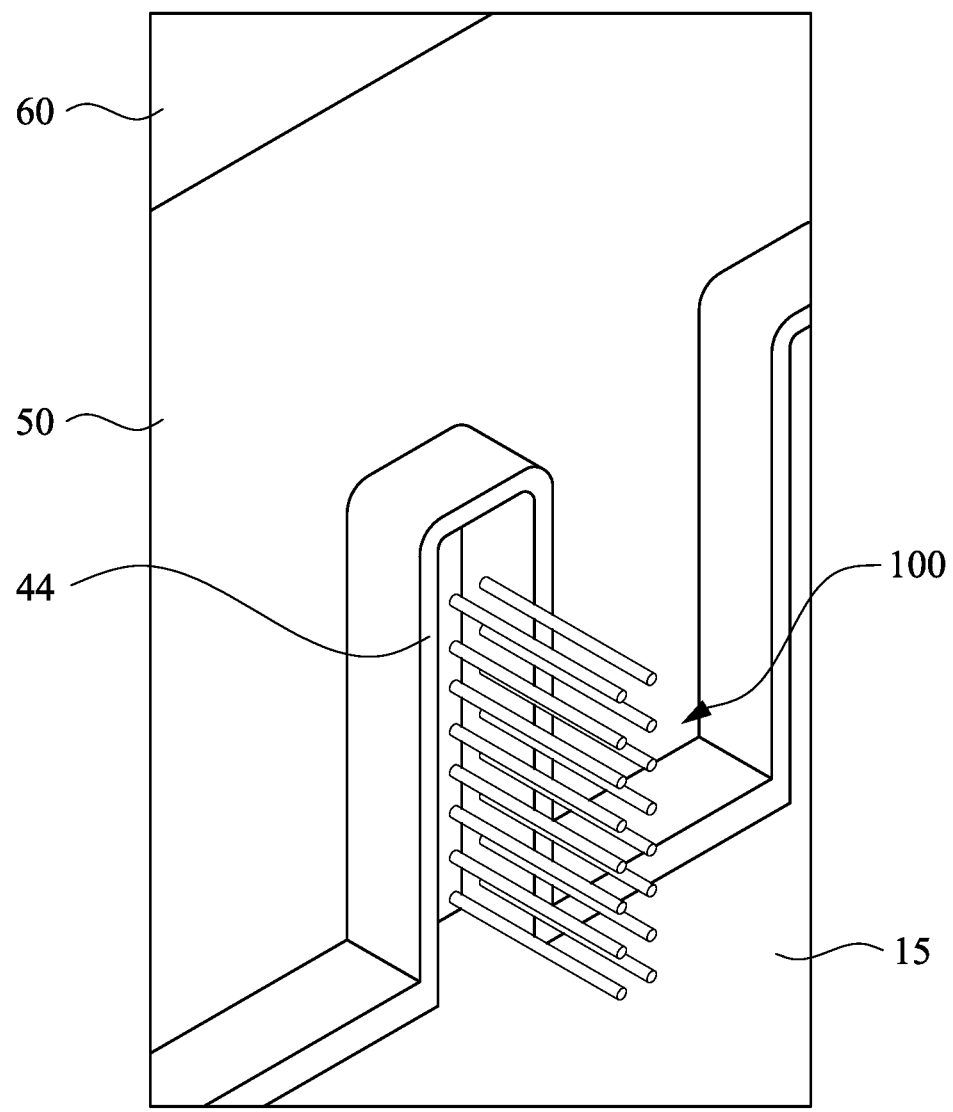

Then, as shown in FIGS. 12A-12C, a second ILD layer 60 is formed over the first ILD layer 50, and source/drain contact openings 65 are formed by using one or more lithography and etching operations. FIG. 12C is an isometric view. By this operation, extension portions 100E of the CNTs 100 are exposed in the source/drain contact openings 65. Extension portions 100E extend from the channel portions 100C of the CNTs 100. The channel portions 100C of the CNTs 100 are the portions of the CNTs 100 that are wrapped around by the gate structure 101.

In an embodiment, when the source/drain contact openings 65 are formed, the support layer 20 is further etched so that the support layer 20 is substantially fully removed, with undercut 45 formed under the one or more of the outer spacers 44 or the liner layer 46, as shown in FIG. 12B.

Figure 12D:
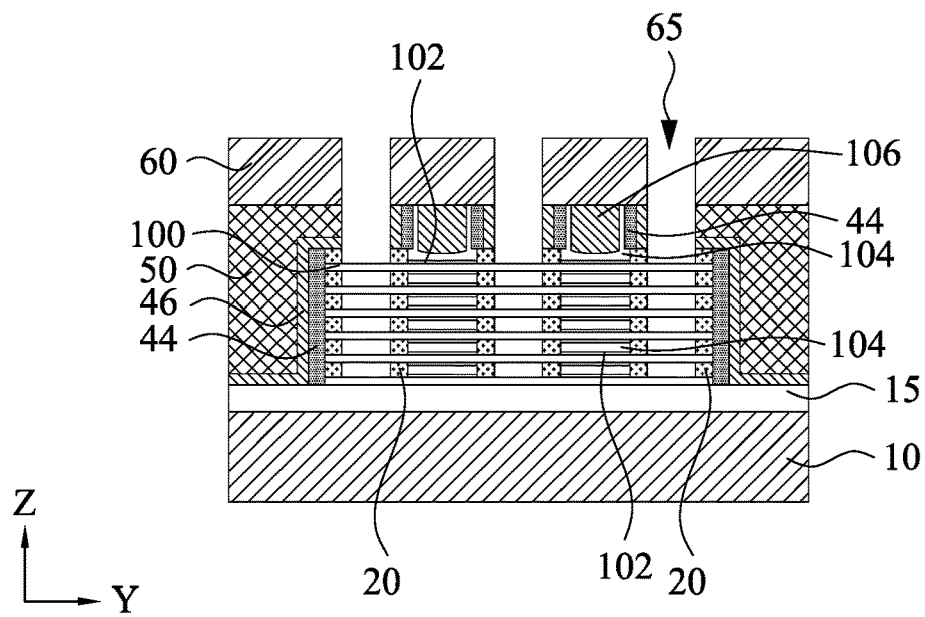

In some other embodiments, as shown in FIG. 12D, a part of the support layer 20 remains under the outer spacers 44 and opposite to the gate structure. When the support layer 20 is made of a dielectric material, the residual support layer 20 functions as part of inner spacers separating the gate electrode layer 106 and subsequently formed source/drain contact 70/72 (FIG. 14B).

Figure 12E:
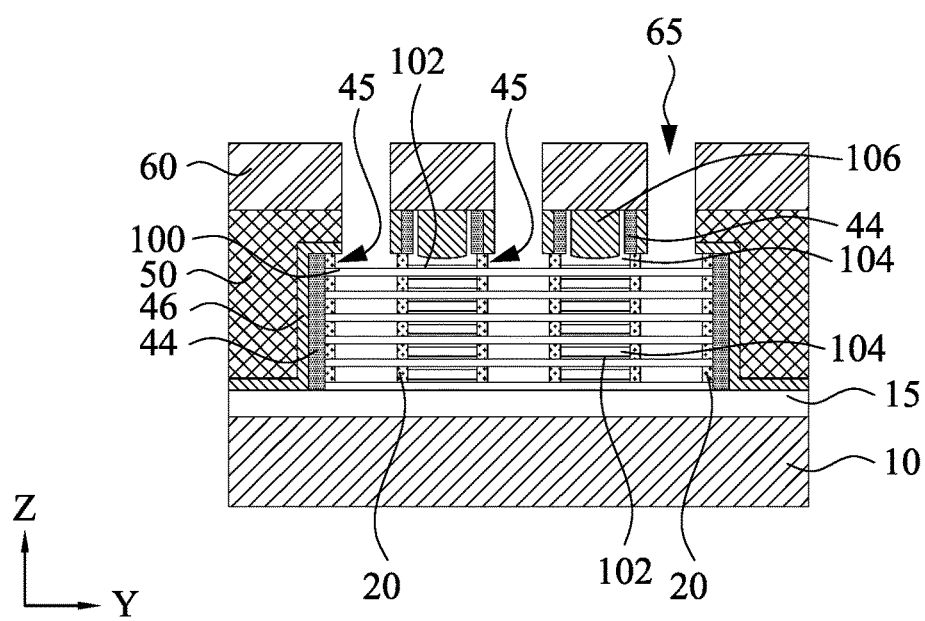

In some further embodiments, when the source/drain contact openings 65 are formed, the support layer 20 is further etched but a thin layer of residual support layer 20 remains as shown in FIG. 12E. The thin layer of the residual support layer 20 extends inward with respect to the outer spacers 44 such that undercuts 45 are formed under the one or more of the outer spacers 44 or the liner layer 46. The undercuts 45 function to facilitate doping of the extension portions 100E of the CNTs 100 that remain in the final device structure, as described herein.

Next, as shown in FIGS. 13A-13D, double layer inner spacer 90 are formed within the source/drain contact openings 65 and adjacent to the gate structure 101, or specifically the edge surface 101E of the gate structure 101. The double layer inner spacer 90 includes at least a first dielectric layer 92 and a second dielectric layer 94 over the first layer 92. In some embodiment, the inner spacer 90 may also include a third layer over the second layer 94. The materials of the multiple layers of the inner spacer 90 are selected to form interface dipole therebetween. With the interface dipole between the multiple layers 92, 94 of the inner spacer 90, n-type doping (electrons) or p-type doping (holes) are introduced into the extension portions 100E of the CNTs 100. As such, the material selections for the inner spacer 90 also depend on the type of doping to be introduced in to the extension portion 100E. For example, $AlO_xN_y$ as a first layer 92 and $HfO_2$ as a second layer 94 are used to introduce n-type doping to the extension portions 100E of the CNTs 100. With reversed deposition order, $HfO_2$ as a first layer 92 and $AlO_xN_y$ as a second layer 94 are used to introduce p-type doping to the extension portions 100E of the CNTs 100. Table 1 below show example material combinations for the double layer inner spacer 90:

TABLE 1

| Material Combinations for Doping CNT | | | |
|---|---|---|---|
| Layer 1 | Layer 2 | Layer 3 | n or p Doping |
| $Al_2O_3$ | $HfO_2$ | n/a | n |
| $Al_2O_3$ | $TiO_2$ | n/a | n |

TABLE 1-continued

| Material Combinations for Doping CNT | | | |
|---|---|---|---|
| Layer 1 | Layer 2 | Layer 3 | n or p Doping |
| $Al_2O_3$ | $SiO_2$ | $Al_2O_3$ | p |
| $Al_2O_3$ | MgO | Cap | n or p |

Figure 13A:
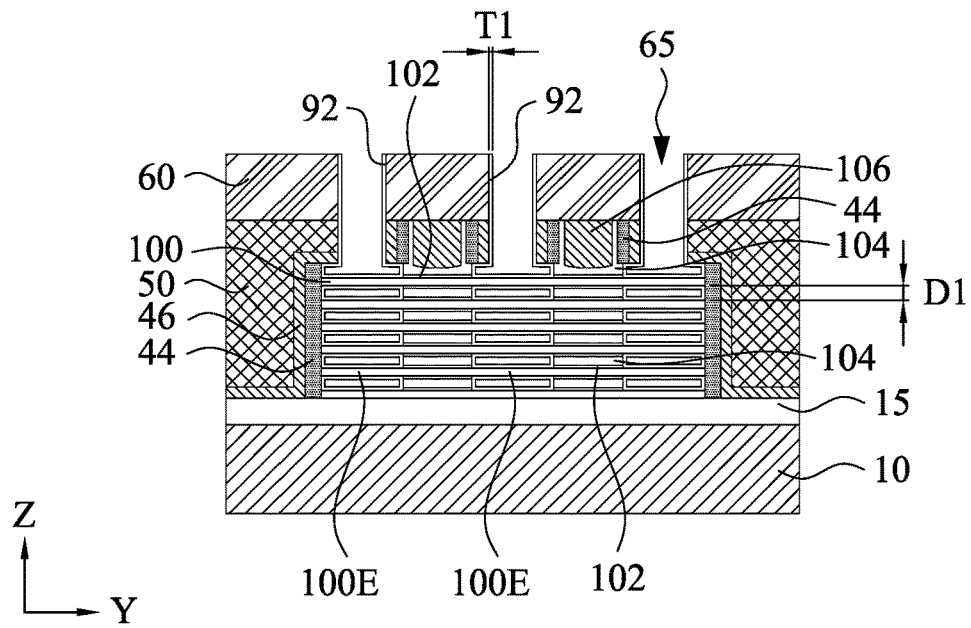
FIGS. 13A, 13B, 13C and 13D illustrate various stages of a sequential fabrication process of a GAA FET in accordance with an embodiment of the present disclosure.

Specifically, as shown in FIG. 13A, the first layer 92 of is formed by suitable film formation methods, such as thermal oxidation, chemical vapor deposition (CVD), physical vapor deposition (PVD) or atomic layer deposition (ALD). For example, the first layer 92 is formed within the aperture 65 over the gate structure 101 and the extension portions 100E of the CNTs 100. The first layer 92 is formed as a thin film with a thickness ranging from about 0.5 nm to about 3 nm. In an embodiment, the first layer 92 is about 1 nm. In an embodiment, the thickness T1 of the first layer is controlled such that the first layer 92 does not fully fill the undercut 45. In an embodiment, the thickness T1 of the first layer is also controlled such that the first layer 92 does not fully fill the space D1 between or among CNTs 100 in vertical direction. That is, T1<½ D1. Such thickness control of the first layer 92 ensures that an interface dipole is formed overlapping the extension portions 100E of the CNTs 100. Due to the small thickness, the vertical portions of the first layer 92, e.g., adjacent to the gate structure 101, may be formed with inconsistent thickness or even with holes. Such imperfections, if any, are acceptable because the second layer 94 is formed over the first layer 92 and the vertical portions of the second layer 94 are not adjacent to the CNTs 100 and are of less interest for the doping purposes as compared with the horizontal portions of the first layer 92.

Figure 13B:
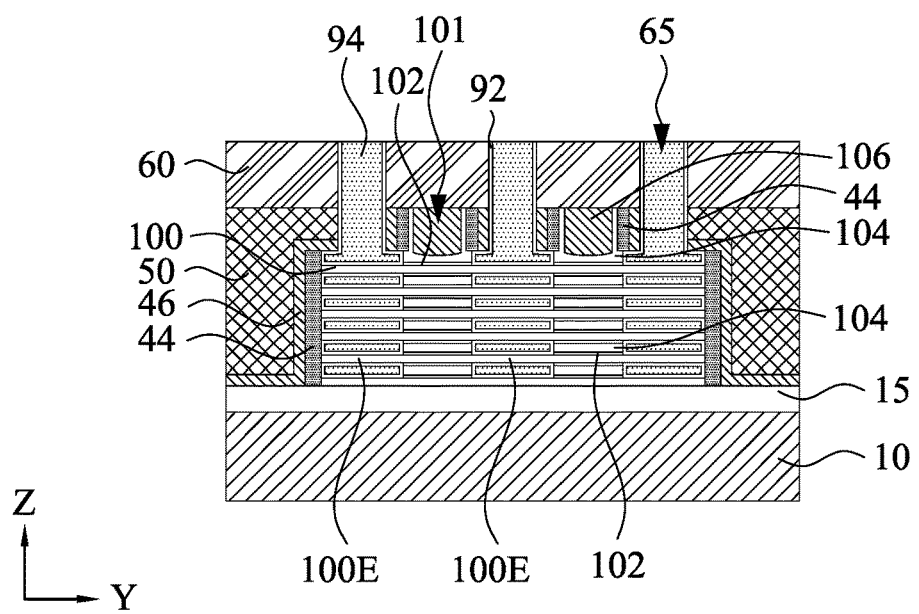

As shown in FIG. 13B, the second layer 94 is formed over the first layer 92. The second layer is formed with a greater thickness than the first layer 92. In an embodiment, the thickness of the second layer 94 ranges from about 2 nm to about 6 nm. In an embodiment, the second layer 94 may be formed to fill the rest of the aperture 65. FIG. 13B shows, as an illustrative example, that the second layer 94 is deposited as a thin layer, which does not limit the scope of the disclosure. The relatively thin first layer 92 facilitates the doping of the extension portion 100E through the interface dipole formed between the first layer 92 and the second layer 94.

Figure 13C:
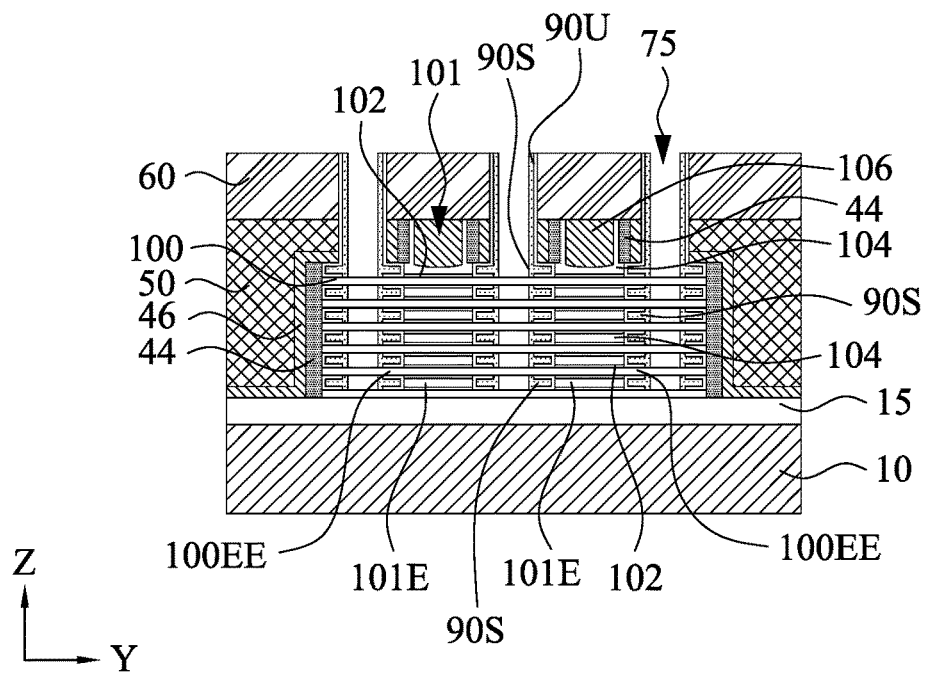

As shown in FIG. 13C, an anisotropic etching is performed to form the inner spacers 90. The anisotropic etching also forms source/drain contact openings 75. In an embodiment, a resultant surface 90S of the inner spacer 90, which is opposite to the gate structure 101, is substantially plumb with the outer of the outer spacer 44 or the outer surface of the liner layer 46. In another embodiment, the surface 90S is formed outwardly beyond the outer surface of the outer spacer 44 or the outer surface of the liner layer 46. Further, in an embodiment, optionally, a thin layer 90U of one or more of the first layer 92 or the second layer 94 may remain adjacent to the outer spacer 44 or the liner layer 46 and may become a second segment 90U of the inner spacer structure 90. Note that the second segment 90U is technically not an "inner spacer" and is referred to as a second segment of the inner spacer 90 only for descriptive purposes.

In one embodiment, as shown in FIG. 13C, the anisotropic etching is selective to the CNTs 100 such that the CNTs 100, or specifically the extension portion 100E remain within the source/drain contact openings 75. Parts 100EE of the extension portion 100E are adjacent to the formed inner spacer 90 and are doped by the interface dipole formed between the first layer 92 and the second layer 94 (and/or the third layer, if any) of the inner spacer 90. The doping concentration is generally in a range of about 0.4-0.6 carriers/nm. With such a doping concentration, the parts 100EE become source/drain extension regions 100EE between the channel portion 100C of the CNTs 100 and the source/drain structures formed in the source/drain contact openings 75. The inner spacer 90 wraps around each of the source/drain extension portion 100EE.

Figure 13D:
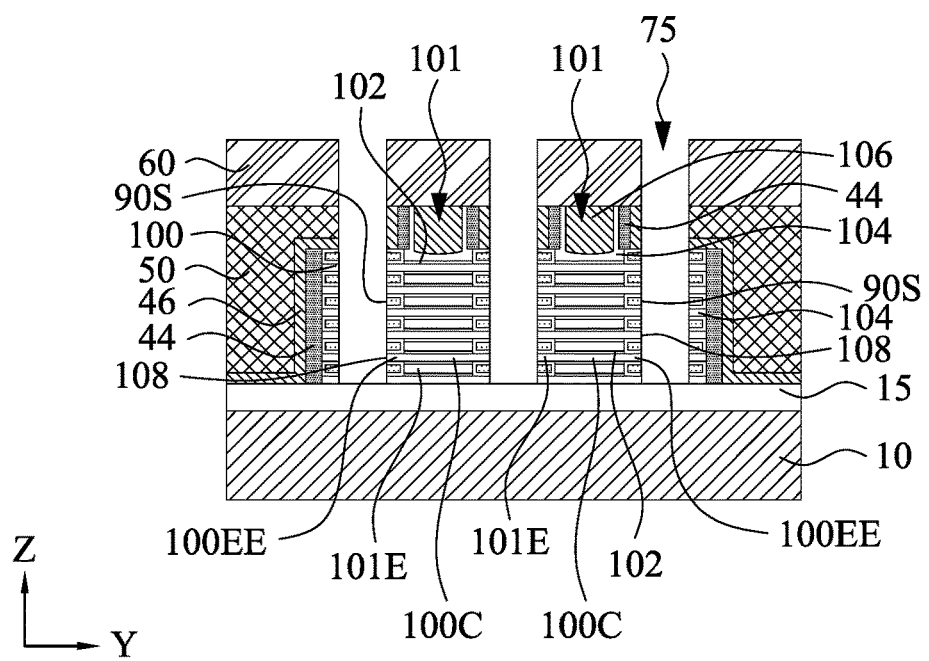

In another embodiment, as shown in FIG. 13D, the anisotropic etching also removes some of the extension portions 100E of the CNTs 100 in forming the source/drain contact opening 75. As such, the edge surfaces 108 of the remaining extension portions 100E are plumb with the surface 90S of the inner spacer 90. The remaining extension portions 100EE are doped by the interface dipole formed between the first layer 92 and the second layer 94 (and/or the third layer, if any) of the inner spacer 90. The doping concentration is generally in a range of about 0.4-0.6 carriers/nm. With such a doping concentration, the remaining extension portion 110E become source/drain extension regions 100EE between the channel portions 100C of the CNTs 100 and the source/drain structures formed in the source/drain contact openings 75.

Figure 14A:
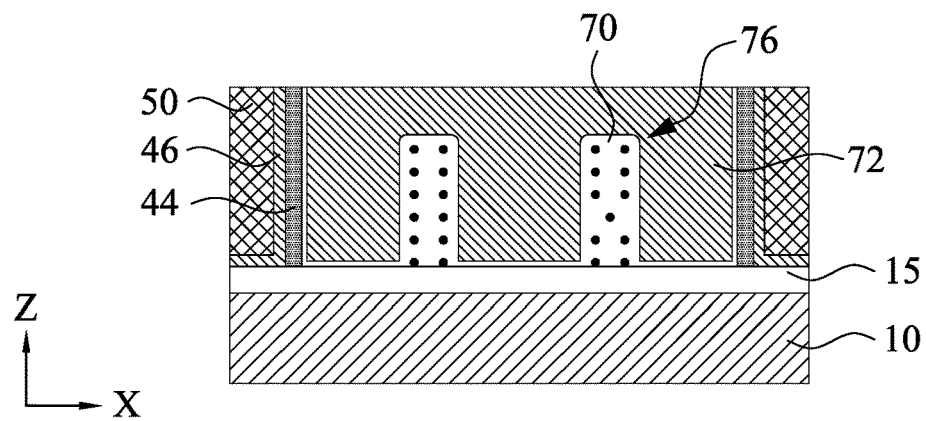
FIGS. 14A, 14B and 14C illustrate various stages of a sequential fabrication process of a GAA FET in accordance with an embodiment of the present disclosure.
Figure 14B:
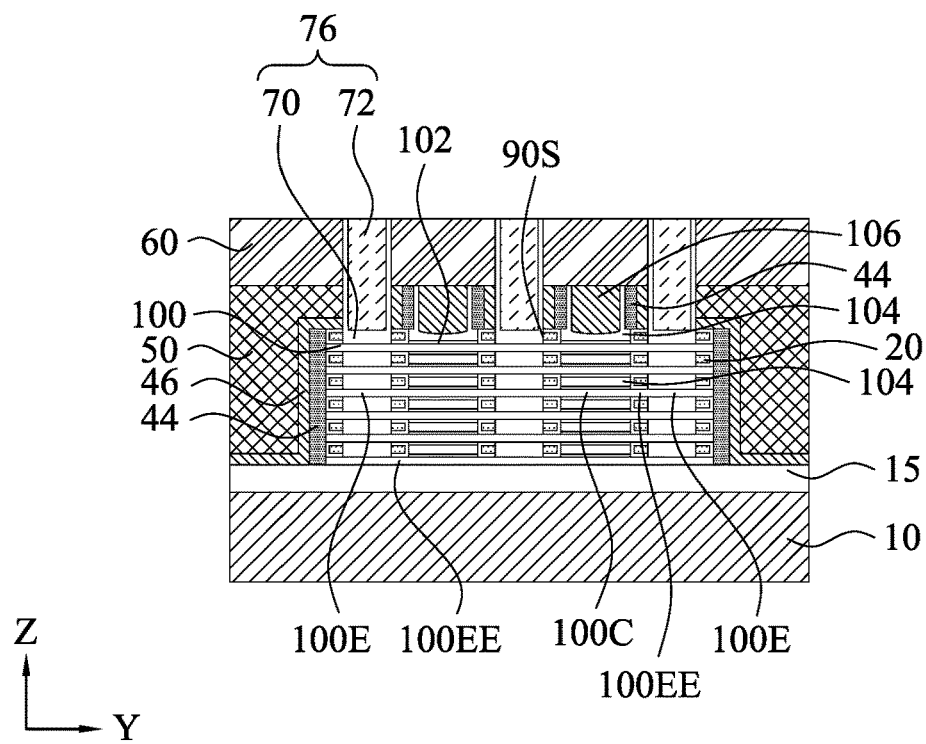

Next, as shown in FIGS. 14A and 14B, which follows the embodiment of FIG. 13C, source/drain structures 76 are formed within the source/drain contact openings 75 by filling the source/drain contact openings 75 with one or more layers of a conductive material. The conductive material includes one or more of W, Cu, Co, Ti, Ag, Al, TiAl, TiAlN, TaC, TaCN, TaSiN, Mn, Co, Pd, Ni, Re, Ir, Ru, Pt, and Zr, Sc, Er, Y, La, or any other suitable conductive materials. In some embodiments, a lower contact layer 70 wraps around the extension portions 100E of CNTs 100 and an upper contact layer 72 is formed over the lower contact layer 70. In some embodiments, the lower contact layer 70 is configured as a work function metal layer. The lower contact layer 70 is Pd, Pt, Ru, Ni, Mg, for pFET or Sc, Er, Y, La, Ni, Mg for nFET. The upper contact layer 72 is one or more of W, Cu and Co in some embodiments, which are metal materials suitable to be interconnection structures under the back-end-of-line processes. The upper contact layer 72 may be configured as a source/drain electrode. In some further embodiment, a third contact layer is formed between the CNTs 100 and the lower contact layer 70. Note that is FIGS. 14B, the second segment 90U is omitted for simplicity purposes.

In an embodiment, as shown in FIG. 14B, the upper contact layer 72 does not extend downward vertically between the CNTs 100. The disclosure is not limited by this example. In other examples, the upper contact layer 72 may extend downward besides and/or between the CNTs 100.

Figure 14C:
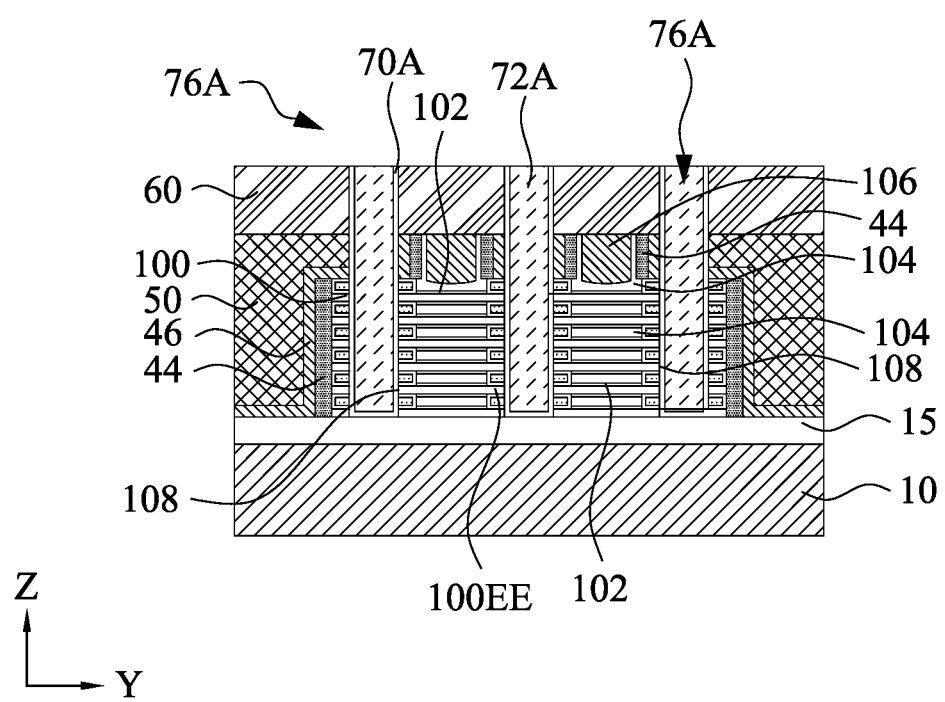

In another embodiment, as shown in FIG. 14C, which follows the embodiment of FIG. 13D, the source/drain structures 76A are formed within the source/drain contact openings 75 and contacting the edge surfaces 108 of the remaining extension portions 100EE of the CNTs 100. In an embodiment, the source/drain structures 76A includes a first contact layers 70A of work function metal materials and a second contact layer 72A of interconnection metal materials suitable for the back-end-of-line processes. The first contact layer 70A contact the edge surfaces 108 of the extension portions 100EE directly, while the second contact layer 72A is formed over the first contact layer 70A and is opposite to the extension portions 100EE in the lateral direction.

Further, in some embodiments, one or more gate contacts are formed at the same time as the source/drain contacts or by different operations from the source/drain contacts.

Figure 15A:
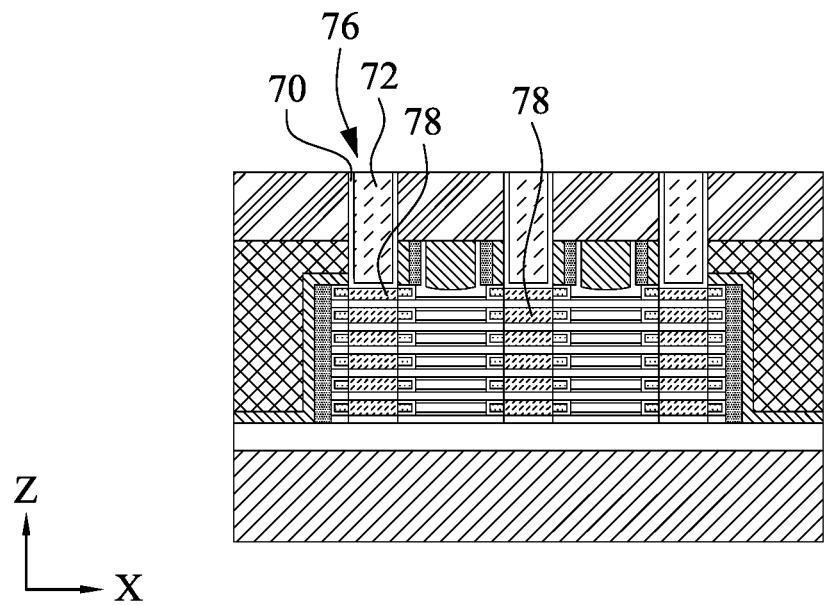
FIGS. 15A and 15B various stages of a sequential fabrication process of a GAA FET in accordance with an embodiment of the present disclosure.
Figure 15B:
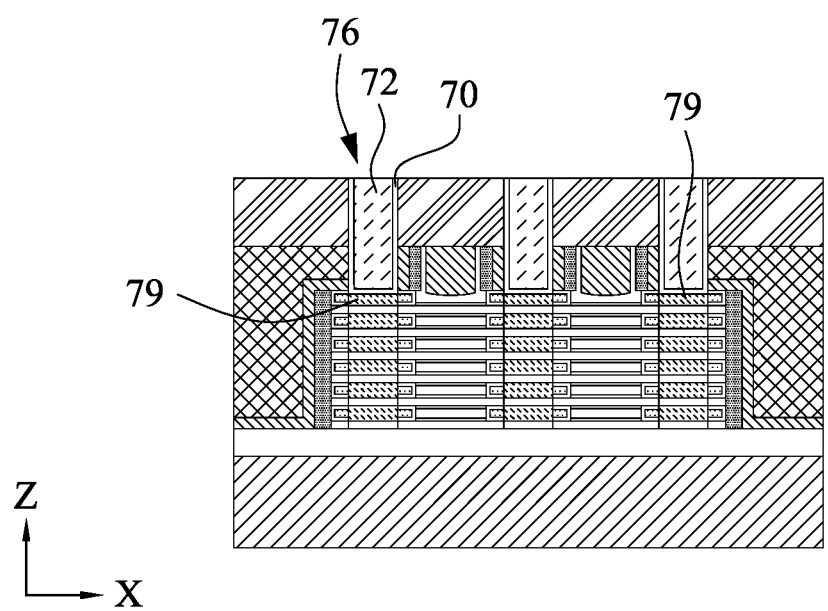

As shown in FIGS. 15A-15B, end-bonded contact regions 78, 79 are formed between the source/drain structure 76 and the source/drain extension portion 100EE of the CNTs 100. The end-bonded contact regions 78, 79 contact the source/drain extension portions 100EE of CNTs 100, at the end region/edge surface 108 thereof. Such end-bonded contacts 78, 79 have low contact resistance that is independent to the contact length.

As shown in FIG. 15A, the end-bonded contact regions 78 are at least partially embedded within the respective CNTs 100E (shown as fully embedded as an illustrative example) and is a metal carbide formed between the CNT 100 and the adjacent metal layer of the source/drain structure 76. The end-bonded contact region 78 is formed through a high-temperature annealing process, e.g., anneal temperature higher than about 900° C.

As shown in FIG. 15B, the end-bonded contact regions 79 are at least partially embedded within the respective CNTs 100 and include the same metal material as the adjacent metal layer of the source/drain structure 76. For example, the adjacent metal layer of the source/drain structure 76 is a metal material that has high carbon solubility, e.g., Ni or Co. The end-bonded contact regions 79 are formed through a moderate-temperature annealing process, e.g., anneal temperature ranging between about 400° C. to about 600° C. With this moderate-temperature annealing process, the carbon atoms of the CNTs 100 dissolve without reacting with the adjacent metal layer of the source/drain structure 76. The dissolved carbon atoms are replaced by the metal material of the adjacent metal layer of the source/drain structure 76, which forms the end-bonded contact regions 79.

For the example embodiment of FIG. 14C, the source/drain structure 76A is formed directly contacting the edge surfaces 108 of the extension portions 100EE of the CNTs 100, i.e., end-bonded. As such, no additional processes are needed to form the end-bonded contacts. However, either high-temperature annealing (e.g., >900° C.) or moderate-temperature annealing (e.g., between about 400° C. and about 600° C.) may be conducted to further enhance the end-bonded contact with the extension portion 100EE of the CNTs 100.

The total number of the CNTs 100 in one GAA FET is in a range from about 5 to about 100 in some embodiments, and is in a range from about 10 about 50 in other embodiments. The total number of CNTs in one GAA FET is different from a total number of CNTs in another GAA FET, in some embodiments. In some embodiments, in a GAA FET, two CNTs among the CNTs contact each other in a horizontal direction, and no CNT contacts another CNT in a vertical direction.

In some embodiments, the source/drain structures 76 are first formed and then the gate structure 101 is formed.

Subsequently, further CMOS processes are performed to form various features such as additional interlayer dielectric layers, contacts/vias, interconnect metal layers, and passivation layers, etc.

Figure 16:
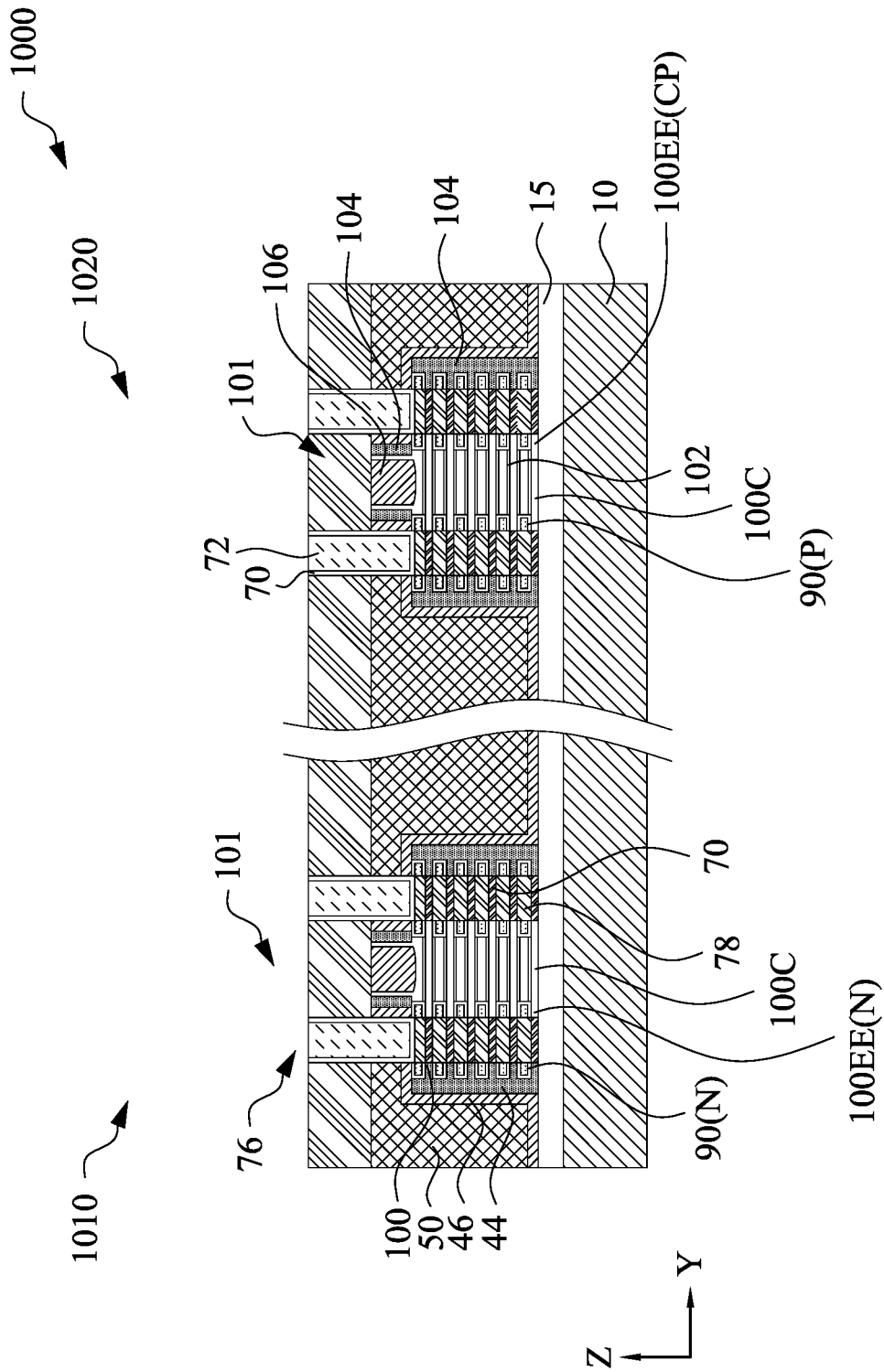
FIG. 16 illustrates a structure of an integrated circuit in accordance with an embodiment of the present disclosure.

FIG. 16 shows an integrated circuit ("IC") device 1000. The IC device 1000 includes an n-type device 1010 and a p-type device 1020 formed over a substrate 10. Each of the n-type device 1010 and the p-type device 1020 includes a gate structure 101 that includes a gate dielectric layer 102, a work function adjustment layer 104 and a gate electrode 106. The work function adjustment layer 104 of the n-type device 1010 and the p-type device 1020 may be the same conductive material or different conductive materials depending device designs or configurations. Each of the n-type device 1010 and the p-type device 1020 includes a channel region containing a plurality of channel portions 100C of CNTs 100. The n-type device 1010 and the p-type device 1020 may include different numbers of channel portions CNTs 100C in their respective channel region or may include a same number of channel portions 100C in their respective channel region. The gate structures 101 warp around the respective channel portions 100C. Each of the n-type device 1010 and the p-type device 1020 includes a source/drain structure 76 that includes a work function layer 70 and a source/drain electrode number 72. For these features that are similar or can be similar between the n-type device 1010 and the p-type device 1020, FIG. 16 uses one reference number to refer to for simplicity purposes.

The n-type device 1010 includes a source/drain extension region 100EE(N) of the CNTs 100, which is positioned between the chancel portion 100C and the source drain structure 76. In an embodiment, the source/drain extension regions 100EE(N) are each positioned laterally between the respective channel portion 100C and the source/drain structure 76. More specifically, a source/drain extension region 100EE(N) contacts through its edge surface/end portion 108 to an end-bonded contact region 78 or 79 (end-bonded contact region 78 shown in FIG. 16) of the source/drain structure 76. The end-bonded contact region 78/79 includes either a metal carbide or a metal material of a conductive layer 70 of the source/drain structure 76 that is adjacent to the source/drain extension regions 100EE(N).

The n-type device 1010 includes inner spacer 90(N) separating the gate structure 101 and the source/drain structure 76. The inner spacer 90(N) are adjacent to the source/drain extension regions 100EE(N). The inner spacers 90(N) includes at least two dielectric layers, a first dielectric layer 92(N) that directly contacts the respective source/drain extension regions 100EE(N) and a second dielectric layer 94(N) that is formed over the first dielectric layer 92(N). The first dielectric layer 92(N) and the second dielectric layer 94(N) form interface dipole therebetween. The interface dipole introduces electrons into the source/drain extension regions 100EE(N) such that the source/drain extension regions 100EE(N) are n-doped. In an embodiment, the first dielectric layer 92(N) is $Al_2O_3$ and the second dielectric layer 94(N) is $HfO_2$. The first dielectric layer 92(N) is relatively thin in a range between about 1 nm to about 2 nm to facilitate the doping of the source/drain extension regions 100EE(N) through the interface dipole.

The p-type device 1020 includes a source/drain extension region 100EE(P) of the CNTs 100, which is positioned between the chancel portion 100C and the source drain structure 76. In an embodiment, the source/drain extension regions 100EE(P) are each positioned laterally between the respective channel portion 100C and the source/drain structure 76. More specifically, a source/drain extension region 100EE(P) contacts through its edge surface/end portion 108 to an end-bonded contact region 78 or 79 (end-bonded contact region 78 shown in FIG. 16) of the source/drain structure 76. The end-bonded contact region 78/79 includes either a metal carbide or a metal material of a conductive layer 70 of the source/drain structure 76 that is adjacent to the source/drain extension regions 100EE(P).

The p-type device 1020 includes inner spacer 90(P) separating the gate structure 101 and the source/drain structure 76. The inner spacer 90(P) are adjacent to the source/drain extension regions 100EE(P). The inner spacers 90(P) includes at least two dielectric layers, a first dielectric layer 92(P) that directly contacts the respective source/drain extension regions 100EE(P) and a second dielectric layer 94(P) that is formed over the first dielectric layer 92(P). The first dielectric layer 92(P) and the second dielectric layer 94(P) form interface dipole therebetween. The interface dipole introduces holes into the source/drain extension regions 100EE(P) such that the source/drain extension regions 100EE(P) are p-doped. In an embodiment, the first dielectric layer 92(P) is $HfO_2$ and the second dielectric layer 94(P) is $Al_2O_3$, which basically reverse the stacking order of the first dielectric layer 92(N) of $Al_2O_3$ and the second dielectric layer 94(N) $HfO_2$ of the n-type device 1010.

Other selections of the first dielectric layer 92(N), 92(P) and the second dielectric layer 94(N), 94(P) in the n-type device 1010 or the p-type device 1020, respectively, are also possible and included in the disclosure. The selected layers of dielectric materials in the inner spacers 90(N), 90(P) form interface dipoles, which dope the adjacent source/drain extension regions 100EE(N) or 100EE(P) of CNTs 100 with electrons or holes, respectively. The effective doped source/drain extension regions 100EE(N), 100EE(P) enhances the performance of the n-type devices 1010, p-type devices 1020 that use CNTs 100 as channel regions.

The first dielectric layer 92(N) is relatively thin in a range between about 1 nm to about 2 nm to facilitate the doping of the source/drain extension regions 100EE(N) through the interface dipole.

The advantages and features of the disclosure are further appreciable through the following example embodiments:

In a method embodiment, a bottom support layer is formed over a substrate. A first group of carbon nanotubes ("CNT") are disposed over the bottom support layer. A first support layer is formed over the first group of CNTs and the bottom support layer such that the first group of CNTs are embedded in the first support layer. A second group of CNTs are disposed over the first support layer. A second support layer is formed over the second group of CNTs and the first support layer such that the second group of CNTs are embedded in the second support layer. A fin structure is formed by patterning at least the first support layer and the second support layer. A sacrificial gate structure is formed over the fin structure. A dielectric layer is formed over the sacrificial gate structure and the fin structure. The sacrificial gate structure is removed so that a part of the fin structure is exposed. Channel regions of the CNTs are exposed by removing the support material from the exposed part of the fin structure. A gate structure is formed around the exposed channel regions of the CNTs. Source/drain extension regions of CNTs are exposed. The source/drain extension regions extend outward from the channel regions of the CNTs. An inner spacer structure is formed adjacent to the source/drain extension regions. The inner spacer structure includes a first dielectric layer adjacent to the source/drain extension regions and a second dielectric layer over the first dielectric layer, the first dielectric layer and the second dielectric layer forming an interface dipole. A source/drain structure is formed adjacent to the source/drain extension regions and the inner spacer structure.

In a structure embodiment, a structure includes a substrate and a carbon nanotube over the substrate. The carbon nanotube including a channel portion and a source/drain extension portion extending from the channel portion. A gate structure wraps around the channel portion of the carbon nanotube. An inner spacer structure wrapping around the source/drain extension portion of the carbon nanotube and adjacent to the gate structure. The inner spacer structure includes a first dielectric layer contacting the source/drain extension portion and a second dielectric layer over the first dielectric layer. The first dielectric layer and the second dielectric layer form an interface dipole. The structure also includes a source/drain structure laterally adjacent to the inner spacer structure and the source/drain extension portion.

In a circuit embodiment, an integrated circuit includes a substrate, a first device and a second device over the substrate. The first device includes a first carbon nanotube over the substrate, the first carbon nanotube including a first channel portion and a first source/drain extension portion extending from the first channel portion. The first device also includes a first gate structure adjacent to the first channel portion of the first carbon nanotube, a first inner spacer structure adjacent to the first source/drain extension portion of the first carbon nanotube, and a first source/drain structure laterally adjacent to the first inner spacer structure and the first source/drain extension portion. The first inner spacer structure includes a first dielectric layer contacting the first source/drain extension portion and a second dielectric layer over the first dielectric layer. The second device includes a second carbon nanotube over the substrate. The second carbon nanotube includes a second channel portion and a second source/drain extension portion extending from the second channel portion. The second device also includes a second gate structure adjacent to the second channel portion of the second carbon nanotube, a second inner spacer structure adjacent to the second source/drain extension portion of the second carbon nanotube, and a second source/drain structure laterally adjacent to the second inner spacer structure and the second source/drain extension portion. The second inner spacer structure includes a third dielectric layer contacting the second source/drain extension portion and a fourth dielectric layer over the second dielectric layer. The third dielectric layer is different from the second dielectric layer or the fourth dielectric layer is different from the second dielectric layer. The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method of forming a gate-all-around field effect transistor ("GAA FET"), the method comprising:
    forming a fin structure over a substrate, the fin structure including a plurality of carbon nanotubes ("CNT") each surrounded by a support layer;
    releasing first portions of CNTs in the fin structure;
    forming a gate structure around the first portions of the CNTs;
    releasing second regions of the CNTs, the second portions extending outward from the first portions of the CNTs;
    forming an inner spacer structure at least partially surrounding the second portions; and
    forming a source or drain structure in contact with the second portions, the inner spacer structure between the source or drain structure and the gate structure.

2. The method of claim 1, wherein the forming the fin structure includes forming the fin structure that includes n group of CNTs embedded in n support layers, n being an integer of three or more.

3. The method of claim 1, wherein the forming the fin structure includes:
    forming a bottom support layer over a substrate;
    disposing a first group of carbon nanotubes over the bottom support layer;
    forming a first support layer over the first group of CNTs and the bottom support layer such that the first group of CNTs are embedded in the first support layer;
    disposing a second group of CNTs over the first support layer;
    forming a second support layer over the second group of CNTs and the first support layer such that the second group of CNTs are embedded in the second support layer;
    patterning at least the first support layer and the second support layer to form the fin structure.

4. The method of claim 3, wherein the bottom support layer is an insulating material.

5. The method of claim 3, wherein the first support layer and the second support layer include a polycrystalline or an amorphous material of one of Si, Ge or SiGe.

6. The method of claim 3, wherein the first support layer and the second support layer include a dielectric material.

7. The method of claim 3, wherein the bottom support layer includes a different material from at least one of the first support layer or the second support layer.

8. The method of claim 3, further comprising performing a planarization operation after at least one of the first support layer or the second support layer is formed.

9. The method of claim 3, wherein the releasing the second regions of CNTs includes:
    forming an opening adjacent to the gate structure to expose portions of the first support layer and the second support layer that are adjacent to the second portions of the CNTs; and
    removing the exposed portions of the first support layer and the second support layer by etching to expose the second portions of the CNTs; and
    wherein the forming the inner spacer structure includes:
    forming a first dielectric layer covering the exposed second portions of the CNTs; and
    forming a second dielectric layer over the first dielectric layer.

10. The method of claim 9, wherein the first dielectric layer and the second dielectric layer form an interface dipole.

11. The method of claim 9, wherein the forming the opening includes forming an undercut region adjacent to the gate structure, and wherein both the first dielectric layer and the second dielectric layer are formed within the undercut region.

12. The method of claim 1, further comprising forming an end-bonded contact region of the source or drain structure, the end-bonded contact region adjacent to an edge surface a second portion of a CNT.

13. The method of claim 12, wherein the end-bonded contact region includes one of a metal carbide material or a metal material.

14. The method of claim 1, wherein the forming the fin structure includes forming the fin structure that includes the plurality of CNTs separated from one another in a vertical direction.

15. The method of claim 1, wherein the forming the gate structure includes forming a gate dielectric layer wrapping around each first portions of the CNTs, a work function adjustment layer on the gate dielectric layer, and a gate electrode layer on the work function adjustment layer.

16. A structure, comprising:
a substrate;
a carbon nanotube over the substrate, the carbon nanotube including a channel portion and a source or drain extension portion extending from the channel portion;
a gate structure wrapping around the channel portion of the carbon nanotube;
an inner spacer structure wrapping around the source or drain extension portion of the carbon nanotube and laterally adjacent to the gate structure; and
a source or drain structure contacting the source or drain extension portion and laterally adjacent to the inner spacer structure.

17. The structure of claim 16, wherein the source or drain structure includes an end-bonded contact region that laterally contacting an edge surface of the source or drain extension portion.

18. The structure of claim 17, wherein the inner spacer structure includes a first dielectric layer and a second dielectric layer, the first dielectric layer and the second dielectric layer forming an interface dipole.

19. An integrated circuit, comprising:
a substrate;
a plurality of carbon nanotubes over the substrate, the plurality of carbon nanotubes spaced away from one another in a vertical direction, the plurality of carbon nanotubes each including a channel portion and a source or drain extension portion extending from the channel portion;
a gate structure surrounding channel portions of the plurality of carbon nanotube;
a spacer structure surrounding source or drain extension portions of the plurality of carbon nanotubes, the spacer structure laterally adjacent to the gate structure; and
a source or drain structure laterally adjacent to the spacer structure, the spacer structure laterally between the gate structure and the source or drain structure.

20. The integrated circuit of claim 19, wherein the spacer structure includes a first dielectric layer and a second dielectric layer, the first dielectric layer and the second dielectric layer forming an interface dipole.

* * * * *